(12) United States Patent
Clarke et al.

(10) Patent No.: US 11,257,683 B2
(45) Date of Patent: Feb. 22, 2022

(54) PERIMETER TRENCH FORMATION AND DELINEATION ETCH DELAYERING

(71) Applicant: FEI Company, Hillsboro, OR (US)

(72) Inventors: James Clarke, Austin, TX (US); Micah LeDoux, Beaverton, OR (US); Jason Lee Monfort, Portland, OR (US); Brett Avedisian, St. Helens, OR (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/903,922

(22) Filed: Jun. 17, 2020

(65) Prior Publication Data

US 2020/0402813 A1  Dec. 24, 2020

Related U.S. Application Data

(60) Provisional application No. 62/865,068, filed on Jun. 21, 2019.

(51) Int. Cl.
*H01L 21/32* (2006.01)
*H01L 21/3213* (2006.01)
(Continued)

(52) U.S. Cl.
CPC ......... *H01L 21/32131* (2013.01); *G01N 1/32* (2013.01); *G11C 5/025* (2013.01);
(Continued)

(58) Field of Classification Search
CPC .. G01N 1/32; G11C 5/06; G11C 5/025; H01J 37/3056; H01J 37/3053; H01J 37/31;
(Continued)

(56) References Cited

U.S. PATENT DOCUMENTS 4,900,695 A * 2/1990 Takahashi ............. H01L 21/768
250/492.2
5,258,316 A * 11/1993 Ackley ............... H01S 5/18327
372/45.01
(Continued)

OTHER PUBLICATIONS

Carleson et al., "Delayering on Advanced Process Technologies using FIB", Conference Proceedings from the 40th International Symposium for Testing and Failure Analysis, pp. 430-435 (Nov. 2014).
(Continued)

*Primary Examiner* — Rodney G McDonald
(74) *Attorney, Agent, or Firm* — Klarquist Sparkman, LLP

(57) ABSTRACT

Apparatus and methods are disclosed for sample preparation, suitable for online or offline use with multilayer samples. Ion beam technology is leveraged to provide rapid, accurate delayering with etch stops at a succession of target layers. In one aspect, a trench is milled around a region of interest (ROI), and a conductive coating is developed on an inner sidewall. Thereby, reliable conducting paths are formed between intermediate layers within the ROI and a base layer, and stray current paths extending outside the ROI are eliminated, providing better quality etch progress monitoring, during subsequent etching, from body or scattered currents. Ion beam assisted gas etching provides rapid delayering with etch stops at target polysilicon layers. Uniform etching at deep layers can be achieved. Variations and results are disclosed.

20 Claims, 12 Drawing Sheets

(51) Int. Cl.
| | |
|---|---|
| *H01L 27/11582* | (2017.01) |
| *G11C 5/02* | (2006.01) |
| *H01L 27/11556* | (2017.01) |
| *H01J 37/305* | (2006.01) |
| *H01L 21/67* | (2006.01) |
| *G11C 5/06* | (2006.01) |
| *G01N 1/32* | (2006.01) |

(52) U.S. Cl.
CPC ............ *G11C 5/06* (2013.01); *H01J 37/3056* (2013.01); *H01L 21/67069* (2013.01); *H01L 27/11556* (2013.01); *H01L 27/11582* (2013.01)

(58) Field of Classification Search
CPC ..... H01J 2237/3174; H01J 2237/31745; H01J 2237/31749; H01L 21/32131; H01L 21/67069; H01L 27/11556; H01L 27/11582; H01L 27/0688; C23C 14/221; C23C 16/486
USPC .......................................... 204/192.34, 298.36
See application file for complete search history.

(56) References Cited

U.S. PATENT DOCUMENTS

| | | |
|---|---|---|
| 6,268,608 B1 | 7/2001 | Chandler |
| 9,064,811 B2 | 6/2015 | Rue et al. |

OTHER PUBLICATIONS

Donnet et al., "Localized FIB delayering on advanced process technologies", Proceedings of the 21th International Symposium on the Physical and Failure Analysis of Integrated Circuits, pp. 146-149, (Jun. 2014).

Ledoux et al., "Gas-enhanced PFIB surface preparation enabled metrology and statistical analysis of 3D NAND devices", 11 pages, also published as Ledoux et al., "Gas-enhanced PFIB surface preparation enabled metrology and statistical analysis of 3D NAND devices", Proceedings vol. 10959, Metrology, Inspection, and Process Control for Microlithography XXXIII; 109590I, (Mar. 2019).

Nowakowski et al., "Top-down delayering by low energy, broad-beam, argon ion milling—a solution for microelectronic device process control and failure analyses", 28th Annual SEMI Advanced Semiconductor Manufacturing Conference, pp. 95-101 (May 2017).

Samsung, "V-NAND technology Yield more capacity, performance, endurance and power efficiency", 8 pages (Sep. 2014), accessed from https://www.samsung.com/us/business/oem-solutions/pdfs/V-NAND_technology_WP.pdf on Apr. 23, 2019.

Tilson et al., "STEM/EDS Metrology and Statistical Analysis of 3D NAND Devices", IEEE International Symposium on the Physical and Failure Analysis of Integrated Circuits, 5 pages (Jul. 2018).

Wikipedia, "Focused ion beam", available from https://en.wikipedia.org/wiki/Focused_ion_beam, pp. 1-4 (Mar. 2019).

\* cited by examiner

PERIMETER TRENCH FORMATION AND DELINEATION ETCH DELAYERING

CROSS REFERENCE TO RELATED APPLICATION

This application claims the benefit of U.S. Provisional Application No. 62/865,068, filed on Jun. 21, 2019, which application is incorporated herein by reference in entirety.

FIELD

The disclosure pertains to sample preparation for evaluation of multilayer structures.

BACKGROUND

Stacked electronic circuits can offer higher performance in a smaller package as compared to traditional planar circuits. Monolithic and die-stacking techniques are both used; the former can be more compact. Stacked functional layers can be similar, as in memory banks, or dissimilar. Dissimilar functional layers can employ similar process steps, as for microprocessors and peripheral logic, or can employ different materials or process steps, as for digital and analog circuit layers, or for electro-optics integrating electronic circuitry layers and optical waveguide or device layers in a single package.

Evaluation and metrology can be pressed to keep pace with advances in manufacturing. While ion beam tools can provide pinpoint transverse positioning, accurate vertical positioning can also be desirable. It can be challenging to expose a thin target layer, buried many layers deep within a device, uniformly over a wide device area. Accordingly, there remains a need for improved technology to prepare samples for characterization of buried layers.

SUMMARY

Methods and apparatus are disclosed for sample preparation, suitable for stacked electronic circuits including but not limited to vertical NAND flash memory. In some examples, current paths are established between sample layers by trenching around a region of interest and coating an electrically conducting material on the exposed lateral surface. In further examples, delayering is performed by a combination of gas chemistry and ion beam etching, which can provide etch stop on target layers and can provide uniform exposure of a thin target layer, buried deep within a device, across a wide device area.

In a first aspect, the disclosed technologies can be implemented as an apparatus incorporating an etcher and a controller coupled to the etcher. The controller is configured to electrically isolate a region of interest (ROI) of a sample from a surrounding area of the sample, by causing the etching tool to etch a trench around the ROI. The controller is further configured to electrically couple two or more layers of the sample, by causing electrically conductive material to be coated over a lateral surface of the ROI exposed by the trench.

In some examples, the etching tool can include an ion milling machine, which can generate a Ga+ or Xe+ ion beam. The trench etching can be performed by milling, and the electrical coupling can be performed as a byproduct of the milling of the trench. The trench can have a width in the range of 0.2-5 μm.

In further examples, the apparatus can include an ion beam assisted coater for performing the electrical coupling. The trench can be etched to at least a depth of a conductive base layer of the sample. The electrically coupled layers can include a base layer and a conductive layer above the base layer. The trench can have a transverse inner dimension in the range 5-500 μm, or a depth in the range of 1-10 μm.

In a second aspect, the disclosed technologies can be implemented as a method of improving signal quality for ion beam delayering of an ROI of a sample. The ROI is electrically isolated from a surrounding area of the sample, by milling a trench around the ROI to at least a depth of a base layer of the sample. Electrically conductive material can be deposited over a lateral surface of the ROI exposed by the trench.

In some examples, the sample can include: a stacked electronic structure, a vertical flash memory structure, or a 3D-NAND stack. At least one of the sample layers can be a polysilicon layer. The electrical isolation can be achieved by ion beam milling. The deposition of electrically conductive material can electrically couple the base layer to one or more conductive layers above the base layer. The electrically coupling can be achieved as a byproduct of the ion beam milling. In other examples, the electrically coupling can be achieved by ion assisted coating or ion assisted chemical vapor deposition.

In an additional aspect, the disclosed technologies can be implemented as computer-readable media storing computer-readable instructions. When executed by one or more processors, the instructions cause the processor(s) to actuate an etcher and a coater. The etcher is caused to etch a trench around a region of interest (ROI) of a sample, thereby electrically isolating the ROI from an area of the sample surrounding the ROI. The coater is caused to coat electrically conductive material over a lateral surface of the ROI, as exposed by the etched trench. Thereby two or more layers of the sample, within the ROI, are electrically coupled.

In some examples, the processor(s) can cause the sample within the ROI to be delayered. The delayering can be monitored using a measured body current from the electrically coupled layers. The monitoring can include detecting a target layer, e.g. at a polysilicon layer, and can include pausing the delayering at the detected target layer. The target layer can be an etch stop. In further examples, the delayering can include etching the sample with a combination of gas etch and ion beam etch. The etching can be temporally arranged as a plurality of etching phases. Gas proximate to the sample can be purged, with the ion beam etch disabled, in purging phases between successive etching phases. In additional examples, the etcher and coater can be distinct machines, or can share a common machine such as a focused ion beam (FIB) tool.

In another aspect, the disclosed technologies can be implemented as an apparatus having a gas etchant source, an ion beam source, and a controller. The gas etchant source and the ion beam source are arranged to respectively deliver a gas etchant and an ion beam to a working surface on a sample. The controller is configured to control the gas etchant source and the ion beam source to provide an alternating sequence of etching and purging phases. During an etching phase, etching is performed with a combination of chemical etching and ion beam etching of an ROI of the sample. During a purging phase, the gas etchant proximate to the working surface is refreshed. Thereby the apparatus can reach successive etch stops at respective target layers of the sample.

In some examples, the apparatus can include an output port for providing a signal providing indication of the etch stops to the controller. The etch stops can be detected by monitoring changes in the etching rate. The etch stops can result from differential etching rates in the target layers as compared other layers of the sample. The controller can be configured to pause the alternating sequence of etch phases and purge phases in response to reaching the etch stops.

In further examples, the gas etchant source can include a supply of 2,2,2 trifluoroacetamide (TFA). The ion beam source can be configured to provide a Xe+ beam onto the working surface. The sample can include a stacked electronic structure, a vertical flash memory structure, or a 3D-NAND stack. At least one of the target layers can be a polysilicon layer.

In a further aspect, the disclosed technologies can be implemented as a method of delayering a stacked electronic structure. The stacked electronic structure is etched with a combination of gas etch and ion beam etch, with the etching performed during a succession of etching phases. Purging phases interleaved between successive etching phases are used to purge gas near the stacked electronic structure, with the ion beam etch disabled. A signal is monitored to detect etch progress and determine successive etch stops at respective target layers of the stacked electronic structure.

In some examples, the duration of a purging phase can be at least 10% the duration of an immediately preceding etching phase. The gas etch can be performed with a trifluoroacetamide compound. The ion beam etch can be performed with a Xe+ or Ga+ ion beam. The monitored signal can include a measured scattered electron current or a measured body current from the stacked electronic structure. The stacked electronic structure can include a vertical flash memory structure or a 3D-NAND stack. The target layer can include polysilicon.

In further examples, the method can include pausing the etching at a detected one of the etch stops, making an image of a target layer, or making a measurement on a target layer. The target layer can be exposed across a region of interest without unexposed islands or etched-through holes. The target layer thickness can be in a range of 10-100 nm.

In additional examples, a surface roughness parameter (mean profile deviation or peak-to-valley height) can be less than or equal to a threshold. The parameter can be measured over 90% of the exposed target layer, at the tenth target layer reached during a delayering method. The threshold can be in the range 2-5 nm. In other examples, a performance parameter can be a ratio of a first area associated with an exposed region of the given target layer to a second area associated with an exposed portion of a reference layer above the given target layer. The first area can be an area of a largest convex contiguous puncture-free exposed region of the given target layer. The target layer can be at least the tenth target layer reached during the method. The second area can be an area enclosed by an exposed perimeter of the reference layer. The reference layer can be a target layer immediately preceding the given target layer. The threshold can be 60%.

In yet another aspect, different aspects of the disclosed technologies can be freely combined. For example, an apparatus can include the structures for etching a trench and coating a lateral surface of the trench, and can also include the structures for ion beam assisted chemical delayering of a region of interest inside the trench. As another example, a method can include etching a trench around a region of interest on a sample, coating a lateral surface of the trench, and subsequently delayering the region of interest with a combination gas and ion beam etch. The delayering of such combinations can include etch stop detection at target layers, an alternating sequence of etching and purging phases, or any features from any of the examples described herein.

The foregoing and other objects, features, and advantages of the disclosed technology will become more apparent from the following detailed description, which proceeds with reference to the accompanying figures.

DETAILED DESCRIPTION

Terminology

Figure 1:
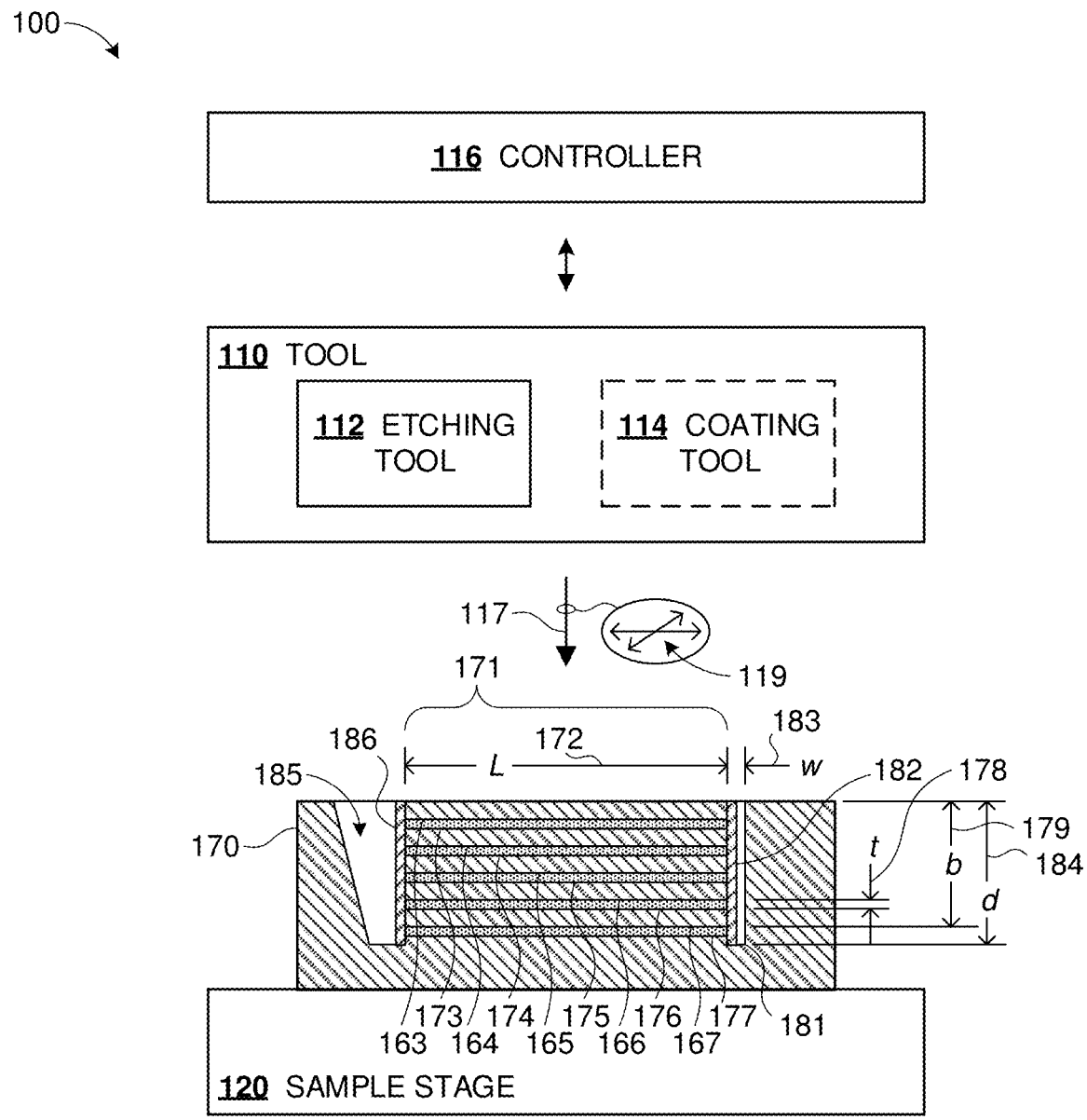
FIG. 1 illustrates a first example apparatus according to the disclosed technologies.

The term "base layer" refers to a lowest layer of interest in a sample. In samples that are electronic structures, the base layer can be an electrically conducting layer.

The term "convex" refers to an area having a perimeter which is convex, i.e., for any two points A, B of the convex area or its perimeter, all points on straight line AB are part of the convex area.

The term "critical dimension" (CD) refers to a minimum feature size of a sample or portion thereof. Commonly, CD refers to a feature size in a transverse dimension, i.e. in a layer of a device, and not including the thickness extent.

The term "delayer" refers to a subtractive process for removing one or more layers of a multi-layer sample, for example by etching (including milling).

The term "etch" refers to a subtractive process for removal of material from a sample. Etching can be performed by a variety of techniques including, without limitation, ion beam milling, chemical etch (in liquid or gas phase), plasma etch, mechanical milling, grinding, or chemical-mechanical polishing, or by a combination of techniques. For example, ion beam assisted gas etching can be used in some embodiments of the disclosed technology. Commonly, etching can be performed according to a pattern, however this is not a requirement. Patterning can be achieved through the use of a mask, or by e.g. scanning an ion beam to cover the desired pattern.

The term "etch rate" or "etching rate" refers to a rate at which material is removed from a surface by an etching process, and can be measured in nm/s.

The term "etch stop" refers to a point in an etching process at which etching rate drops, as at a particular layer of a sample. Absent an etch stop, statistical variations in etching rate can accumulate across an etching zone, and some spots can reach a target layer while other spots are still etching a preceding layer or further spots have penetrated through the target layer. With an etch stop, slower etching spots have a chance to catch up, while faster etching spots can be inhibited from penetrating through the target layer to a succeeding layer. An etch stop phenomenon can be achieved through differential etching rates for etchants in different materials—as one example, a resist layer can be impervious to etch. As disclosed herein, certain combinations of e.g. ion beam assisted chemical milling can provide synergy between a largely mechanical ion beam milling process and a chemical etch, for increased differentials between layers and better etch stop performance.

The term "focused ion beam" (FIB) refers to a beam of ions arranged to focus at a spot on a surface. An FIB can be used for analysis, deposition, or removal of material at the focus spot. Commonly, an FIB comprises positive elemental ions, such as Xe+ or Ga+, however these are not requirements. Ion beam species such as Ga+ can be sourced from e.g. a liquid metal ion source (LMIS), while other ion beam species such as Xe+ can be produced in a plasma. An FIB produced with a plasma source can be termed a plasma focused ion beam (PFIB). Commonly, an FIB can be scanned over a pattern on a surface for an analysis, deposition, or removal procedure.

The term "layer" refers to a region of a sample having a transverse extent parallel to a surface of the sample, at some depth, with some material characteristic to distinguish the layer from material at greater and/or lesser depths. Some layers are substantially homogeneous, such as a metallization ground plane, while other layers are heterogeneous to varying degrees. For example, a polysilicon layer can have a mask pattern or can have portions with different doping characteristics; nevertheless, the polysilicon layer can be readily distinguished from other layers above or below. For example, metallization can be embedded within an insulating material layer. Commonly, a layer can be identified by its largest material constituent; alternatively, a layer can be identified functionally, such as a photonic waveguide layer or a metallization layer, even when such layer predominantly contains non-functional or inert material.

The term "major surface" is a surface of the sample whose area is not substantially exceeded by any other surface of the sample. Common planar devices can have two planar major surfaces separated by the thickness of one or more substrates constituting the device. These two major surfaces are referred to as top and bottom respectively, with the top being the surface accessible for process work. Likewise, the term "vertical" can be understood as a direction perpendicular to the top surface. Accordingly, the major surface helps define an orientation of a sample. The term "lateral surface" refers to any surface of a sample having a normal in a direction other than vertical.

The term "mill" refers to a material removal or etching process over a path that is guided by movement or scanning of a milling tool, relative to a sample being milled, over that path. Thus, etching with a focused ion beam (FIB) can be regarded as milling, while diffuse chemical etching may not be considered as milling. Because ion beam assisted chemical etching can be site specific at the location of the ion beam, it too can be regarded as milling.

The term "NAND" refers to a type of nonvolatile (so-called "flash") memory based on an electronic logic NAND gate. A NAND gate has an output value which is False value when two or more inputs are all True; the output value is logical False otherwise. NAND flash can incorporate a floating gate electrode. NAND flash can be preferred in some applications because of its compact geometry. Vertical or 3-D NAND flash memory can extend a two-dimensional array of NAND flash cells to a multi-layer stack having a column of NAND cells one on top of another at each position of the two-dimensional array. In some embodiments, a single NAND cell can be used to store a single bit, while in other embodiments, a single NAND cell can employ multi-level logic to store 2, 3, or more bits in a single cell.

The term "purge" refers to a process for replacing a fluid in a process volume, such as refreshing a process gas (sometimes dubbed "gas refresh"). Through purging, process conditions within the process volume can be restored or partially restored to preferred values. In an example process of gas-assisted ion beam milling, purge can be implemented simply by turning off (gating, or blanking) the ion beam.

The term "region of interest" (ROI) refers to a portion of a sample device to be examined. In the disclosed technologies, the ROI can be examined by a delayering process, where material is removed starting at a top surface, down through successive layers of the sample device. An ROI can be shown as an area on a surface of the sample device, and can extend below the surface to some depth. Commonly, the depth can be less (often, significantly less) than a transverse extent of the ROI, however this is not a requirement: in some examples an ROI can have small transverse extent in at least one transverse direction, with larger depth. An ROI can be shown as an area on an exposed layer of the sample after some delayering, and can be limited to the depth or thickness of the exposed layer, or can be limited to the surface of the exposed layer. The ROI does not refer to any human interest.

A "sample" or "sample device" is an article to be processed according to the disclosed technologies. Common samples are stacked electronic structures, such as vertical NAND. Many other microelectronic devices, electro-optical devices, or photonic devices can be suitable devices. Still further, certain examples of the disclosed technology can be applied to mineral samples, biological samples, chemical samples, or forensic samples.

The term "stacked" describes a three-dimensional structure in which distinct and generally planar functional units are situated one above another. The term "stacked" does not encompass devices in which components have a vertical orientation, e.g. a transistor with a vertical channel, a transistor in which two or more of source, drain, or gate are overlapping, or a vertical cavity surface emitting laser (VCSEL). However, if such a vertical device was situated atop a distinct functional layer, the resulting structure could be considered as stacked. The term "stacked" does not encompass multilayer devices in which a single functional layer (e.g. transistors, or a memory cell) is overlaid with interconnect wiring or metallization. Some stacked structures can be monolithic, that is, manufactured as an integral unit comprising two or more layers of distinct functional units. Other stacked structures can be manufactured as separate dies which are subsequently joined. Stacked electronic devices can offer advantages of compactness, cost, heterogeneous integration (e.g. power, analog, logic, photonics), reduced interconnect, lower power operation, or higher frequency operation.

The term "working surface" refers to an evolving active surface on which process operations are performed. For example, in a delayering process, the working surface can descend through a sample as material is removed. Conversely, in a coating or epitaxial growth process, the working surface can rise above an original surface as material is added.

The terms "top," "bottom," "up," "down," and the like are used for convenience, with respect to a common configuration in which a top surface of a sample is processed, e.g. by ion milling, downward to increasing depths. One of ordinary skill will understand from this disclosure that a choice of actual orientation can be varied without departing from the scope of the disclosed technologies.

Introduction

Process monitoring of critical dimensions (CD), structural shapes, or other characterization at deep layers of three-dimensional samples requires precision and speed in sample preparation, to complement SEM and other diagnostic tools. The requirements for offline characterization, e.g. for fault analysis, are similar.

Ion beam milling can be used to delayer a wide range of samples, including integrated electronic circuits, photonic devices, and integrated electro-optics. Milling can be precisely controlled, and can be an effectively used to prepare samples for subsequent imaging or analysis. In a vertical direction, either scattered electron current or body current can be used to monitor etching progress. These currents can be generally low when etching rate is low, and can be high when etching rate is high. Inasmuch as etching rate can be dependent on a material being etched, the value of the current can be used as an indicator of the material (and hence, layer) being etched, and a step change in measured current can indicate a transition between layers. However, conventional ion beam milling can suffer from signal attenuation at increasing milling depths. Signal attenuation can be due to a range of factors, including without limitation: loss of current through stray paths within a sample; geometric obstacles of side walls surrounding a deep trench; or buildup of milling byproducts or contaminants in a deep trench. Signal attenuation can make it difficult to ascertain having reached a target layer deep within a layer stack. The disclosed technologies are able to address this problem by providing a trench around a region of interest (ROI), to prevent dissipation of current laterally within the sample, and by providing an electrically conductive coating on one or more exposed lateral faces around the ROI, to provide low resistance current paths to channel body current to a base layer of the sample.

Deep layer milling can also be impacted by unevenness across the ROI, which can arise due to statistical fluctuations in the milling process or due to material inhomogeneities within the sample. For shallow layers, the statistical variation in depth can be small in relation to the thickness of a target layer, and a suitably controlled milling process can evenly expose the target layer across the ROI. However, as depth increases, the statistical fluctuations in mill depth increase, while layer thicknesses of comparable layers do not. Conventional ion beam milling can reveal a deep target layer in irregular patches, and can suffer from islands where the mill depth has not reached the target layer, or punctures where the mill depth has gone right through the target layer into a deeper layer—as described in context of FIG. 12 below. The disclosed technologies are able to address this issue by providing etch stop performance at e.g. common polysilicon layers, where the etching rate of ion-beam assisted milling can be suppressed, preventing deeper etched locations from puncturing through and allowing slower etching locations to catch up at the polysilicon layer. This delayering procedure is sometimes referred to as "delineation etch" (DE) delayering.

As stacked devices become increasingly common, with increasing layer counts, and the need for analytic tools to characterize deep layers increases, the disclosed technologies are uniquely poised to enable high quality sample preparation.

First Example Apparatus

FIG. 1 illustrates an example apparatus 100 according to the disclosed technologies. A tool 110, incorporating an etching tool 112 and a coating tool 114, is coupled to be operated by a controller 116. The tool 110 is situated proximate to a sample stage 120. The controller 116 is configured to provide process operations, represented symbolically as arrow 117, using tool 110, on a sample 170 mounted on the sample stage 120.

FIG. 1 shows a region of interest (ROI) 171 on the sample 170. The ROI 171 can incorporate various layers. Some layers 173-177 are labeled in FIG. 1; each successive pair of the layers 173-177 can be separated by one or more additional layers, for which additional detail is omitted from FIG. 1 for clarity of illustration. Generally, some layers 173-177 can exhibit electrical conductivity within their respective planes, while vertical conductivity through the layer stack 173-177 can be poor. For example, layers 173-177 can be polysilicon layers, while the intervening layers 164-167 between successive polysilicon layers can incorporate silicon dioxide, another dielectric, poorly conducting, material, semiconducting, or conducting materials, in any combination. Top layer 163 can be similar to one of the intervening layers 164-167, or can have different structure unique to the top of the sample 170.

The controller 116 can be configured to electrically isolate the ROI 171 from surrounding areas of the sample 170. In some examples, electrical isolation can be achieved by milling a trench 181, 185, with the etching tool 110, around the region of interest 171, and extending to the depth b 179 of a base layer 177. Two different styles of trench 181, 185 are illustrated. Although commonly a single trench style can be used around the perimeter of ROI 171, this is not a requirement. Different trench styles can be used at different sections of the perimeter, or at different depths. Portions of the perimeter of ROI 171 can also be left intact, i.e. without a trench, for example if there are no significant stray current paths at those portions of the perimeter, or at an edge of the sample 170.

Because of the anisotropic nature of sample conductivity, "electrically isolate" is understood within this disclosure to mean that a layer within the ROI is physically cut off from a corresponding layer outside the ROI. Further, "electrical isolation" is understood to operate only up to the depth of trench 181, 185; layers below the trench depth d 184 will not be cut off from neighboring areas, and even above the trench depth d 184 stray paths (e.g. along vias and deeper layers) could still exist, while regions inside and outside the trench 181, 185 are regarded as "electrically isolated" within the meaning of this disclosure.

The controller 116 can be further configured to electrically couple one or more layers 173-176 to the base layer 177. In some examples, the electrical coupling can be achieved by deposition of electrically conductive material 182, 186, with the coating tool 114, over an exposed lateral surface of the ROI 171 exposed by a trench 181, 185. In the example of FIG. 1, the lateral surface of the ROI 171 can include the ends of layers 163-167 or 173-177 which are covered by coatings 182, 186.

Numerous variations are possible. The tool 110 can include an ion milling machine 112 which can be used to mill a trench 181, 185 and electrically isolate the ROI 171 from surrounding areas of the sample 170. In some examples, the ion milling machine 112 can be a plasma focused ion beam (PFIB) machine, which can produce a Xe+ beam 117. In other examples, the ion mill 112 can be a focused ion beam (FIB) machine, which can use a liquid source to produce e.g. a Ga+ beam.

Arrows 119 represent two-dimensional scanning of e.g. an ion beam 117. Whether by scanning the beam 117 or by physical translation of the sample stage 120 relative to the tool 110, the tool 110 can mill a trench 181, 185 around an ROI 171 having transverse extent L 172 up to a maximum extent supported by the tool 110. The maximum extent can be about 5, 10, 20, 50, 100, 200, 500 µm, 1, 2, 5, 10, 20, 50, 100, or 200 mm, or any dimension in the range 5 µm-200 mm. Similarly, the tool 110 can mill trench 181, 185 to at least a depth b 179, up to a maximum depth supported by the tool 110. The maximum depth can be about 1, 2, 5, 10, 20, 50, 100, 200, 500 µm, 1, 2, 5, 10, 20, 50, or 100 mm, or any dimension in the range 1 µm-100 mm.

In some examples, coater 114 can be used to deposit electrically conductive material 182, 186. Coater 114 can employ ion-beam assisted metallization, for example with tungsten hexacarbonyl ($C_6O_6W$) as a precursor, or another chemical vapor deposition (CVD) or sputtering technique. To provide access for coating material to the bottom of trench 185, the trench can be relatively wide, with an aspect ratio (ratio of maximum depth to maximum width) less than 5, less than 3, less than 2, or less than 1, in varying examples. Use of a coater 114 can provide a well-characterized coating layer 186.

In other examples, coater 114 and etcher 112 can share a common ion beam. Electrical coupling can be achieved as a byproduct of milling trench 181. That is, an electrically conductive coating 182 can be formed from material sputtered from the working surface of trench 181. Use of "byproduct coating" can eliminate a separate coating operation and reduce the cycle time for evaluation of the sample 170. In this case, coater 114 and etcher 112 can be substantially the same structure. Additionally, byproduct coating can be performed with a narrow trench having a width w 183 of about 0.2 µm, about 0.5 µm, about 1 µm, about 2 µm, about 5 µm, or any value w 183 in a range between 0.2 and 5 µm. The geometry of a narrow trench can favor redeposition of sputtered material onto an exposed lateral surface, versus expulsion outside the trench. However, a narrow trench is not a requirement for byproduct coating. The narrow trench can also speed up the cycle time, as only a small mass of material needs to be removed, which can be a consideration in a production environment. A narrow perimeter trench is sometimes dubbed a frame or border trench, and a milling operation to produce such a trench is sometimes dubbed frame milling or border milling.

First Example Method

Figures 2A, 2B:
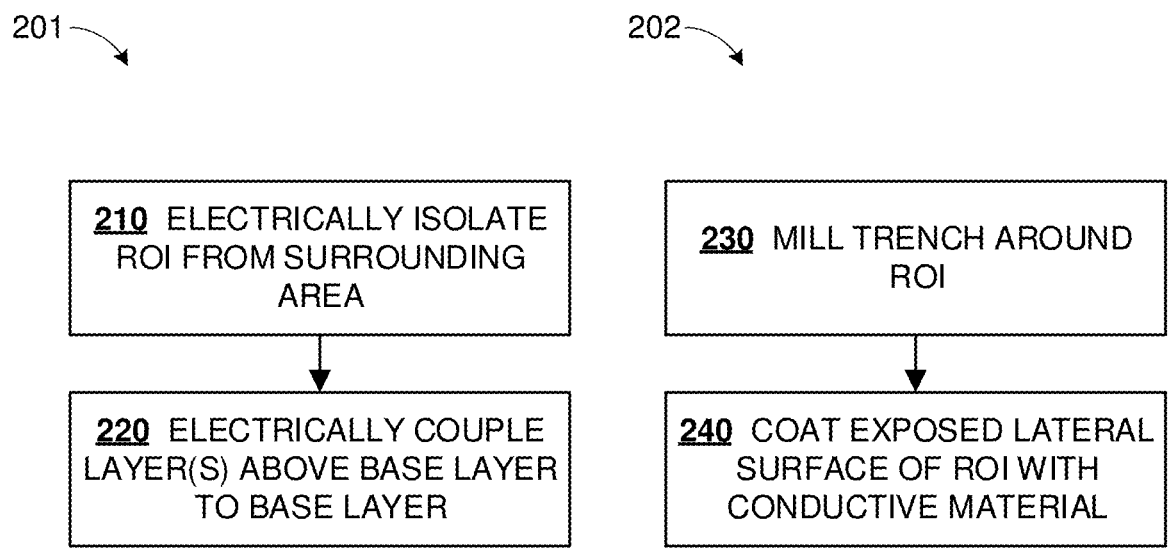
FIGS. 2A-2B are two flowcharts of a first example method according to the disclosed technologies.

FIGS. 2A-2B are two flowcharts 201, 202 of an example method according to the disclosed technologies. As described herein, controlling the flow of body current during delayering of a device can be advantageous for monitoring and controlling the delayering process.

Referring to FIG. 2A, a region of interest (ROI, e.g. 171) can be electrically isolated from a surrounding area at process block 210. At process block 2B, some, all, or selected layers (e.g. layers 173-176) above a base layer (e.g. layer 177) can be electrically coupled to the base layer. The base layer can be a polysilicon or other conductive layer.

Seen from the perspective of FIG. 2B, a trench can be milled around the ROI at process block 230. At process block 240, an exposed lateral surface of the ROI can be coated with conductive material (e.g. coating 182, 186).

In some examples, the electrical isolation of process block 210 can be performed by the milling process of block 230. Milling can be performed as ion beam milling. In further examples, the electrical coupling of process block 220 can be performed by the coating at process block 240. The coating provided at process block 240 can be a byproduct of milling the trench at process block 230, or can be a separate process. The coating process 240 can be an ion assisted coating process, such as ion assisted chemical vapor deposition or another coating process.

Through the disclosed methods, lateral dissipation of body currents during a subsequent delayering process can be prevented, and the body currents can be consistently guided to the base layer, from which the body currents can be accurately measured.

The disclosed method can be applied to a stacked electronic structure, such as a vertical flash memory structure or a vertical NAND stack.

Figure 3A:
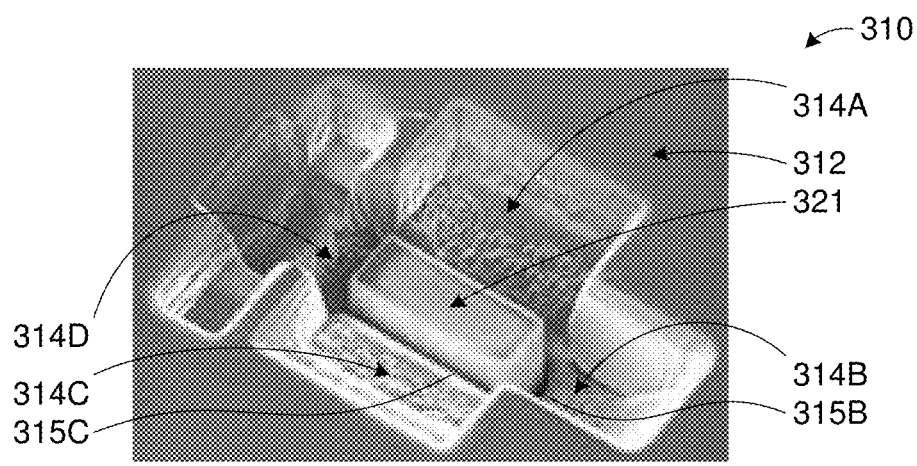
FIGS. 3A-3C are microphotographs illustrating a procedure according to the disclosed technologies.
Figure 3B:
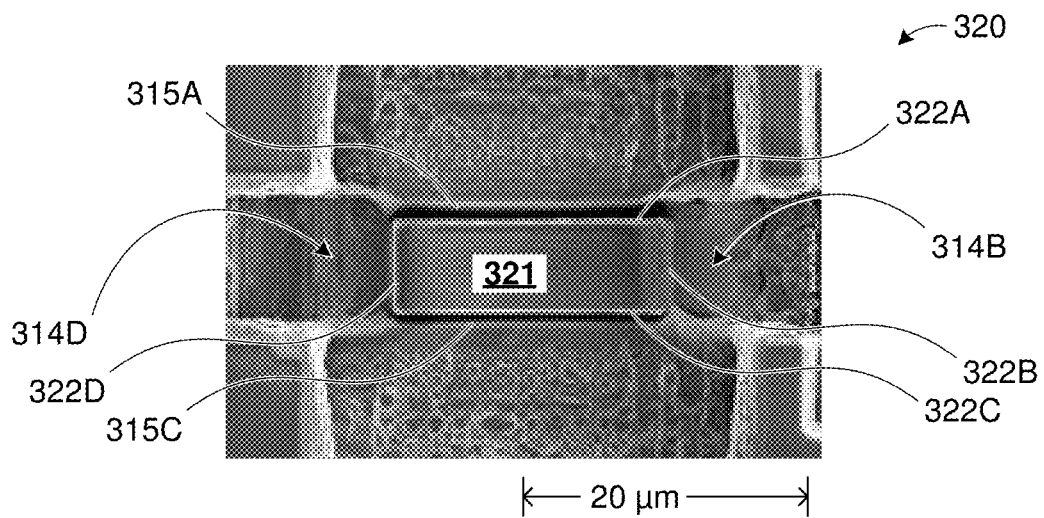
Figure 3C:
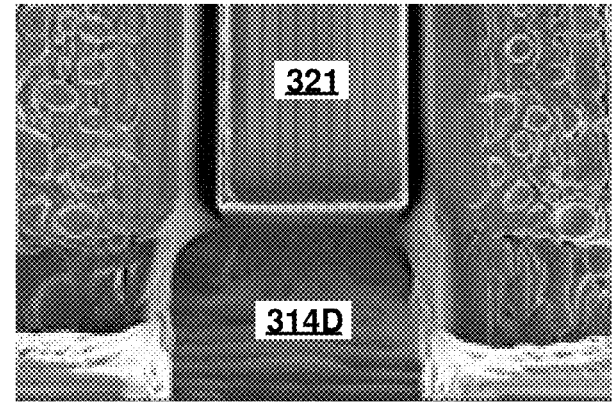

FIGS. 3A-3C are microphotographs 310, 320, 330 illustrating a procedure according to the disclosed technologies. All microphotographs 310, 320, 330 show the same sample, albeit at different stages of the illustrated procedure. Microphotograph 310 is an oblique view showing trench cuts 314A-314D milled around an ROI 321 to isolate successive layers of the ROI from a surrounding area 312. Each illustrated trench 314A-314D has a volume excavation region as shown, and additionally a narrow slot trench (315B, 315C being visible in FIG. 3A) immediately adjacent the ROI 321.

Microphotograph 320 is a top-down view of the same sample after partial fill of short-side trenches 314B, 314D. Along the long sides 322A, 322C, narrow slot trenches 315A, 315C have not been filled and are visible, while slot trenches e.g. 315B on the short sides 322B, 322D have been filled. Microphotograph 330 is a top-view similar to 320, albeit rotated 90°. Coating can be selectively applied to one or more sides; the sides to be coated can be selected based on anisotropic structure or conductivity of sample layers.

Example Electronic Structure

Figure 4:
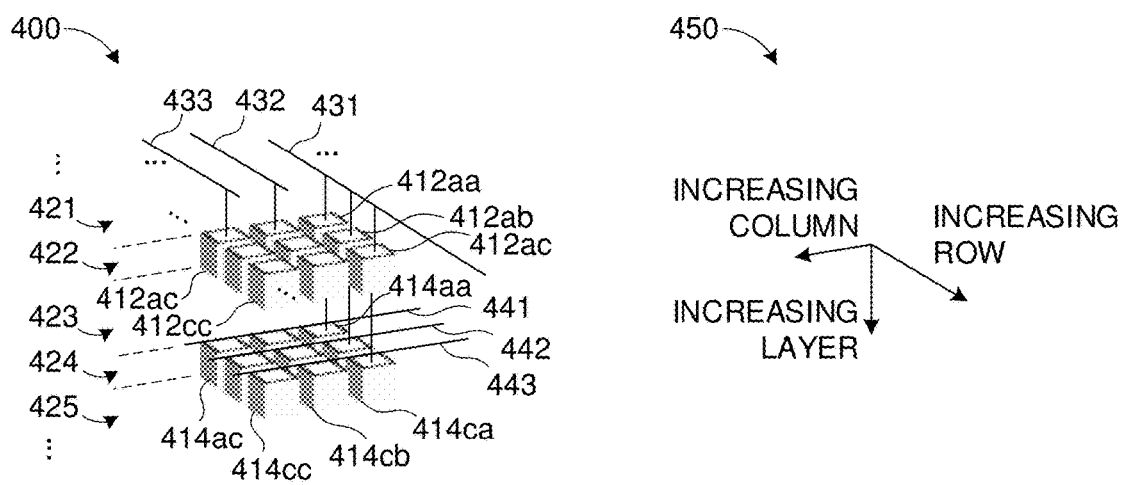
FIG. 4 is an illustration of an example electronic structure to which the disclosed technologies can be applied.

FIG. 4 is an illustration of an example electronic structure 400 to which the disclosed technologies can be applied. A three-dimensional array of individual cells 412xy (in layer 422), 414xy (in layer 424) can be organized as layers, rows, and columns. As illustrated, x can take values a, b, c according to a row position, while y can take values a, b, c according to a column position. The cells can be selected and accessed through arrays of conductive traces dubbed "lines" (typically metallization) organized along the axes of the structure 400. Each row in each layer typically has a respective row-address line. For example, row-address lines 441-443 can be provided for respective rows of cells 414ay, 414by, 414cy. Similar row-address lines (not shown) can service cells 412*xy* Each vertical plane of cells transverse to the row-address lines 441-443 can have a respective plane or column address line 431-433. As an implementation example, in a structure 400 having L layers, with R rows and C columns within each layer, the total number of column-address lines can be C, and the total number of row-address lines can be L×R. Then, the selection of e.g. a particular column-address line (e.g. 433) and row-address line (e.g. 443) can be used to uniquely select a single cell (e.g. 414*cc*). Legend 450 indicates the directions of increasing row number, increasing column number, and increasing layer number for structure 400.

In the illustration, the array of cells can principally occupy layers 422, 424, which alternate between layers 421, 423, 425. Each of the layers can themselves have multiple sub-layers. In some examples, a layer 422, 424 can comprise polysilicon, while the intervening layers 421, 423, 425 can comprise a mix of insulator (e.g. silicon dioxide, silicon nitride) and metallization. Cell layers 422, 424 can be of particular interest for characterization of structure 400. However, layers 421, 423, 425 can also be characterized with the disclosed technologies, as described herein.

In some examples, structure 400 can be a memory device, such as a flash memory device, a dynamic random access memory (DRAM) device, a static random access memory device (SRAM), a read-only memory (ROM), a programmable read-only memory (PROM), or an electrically erasable programmable read-only memory (EEPROM). Structure 400 can be a three-dimensional, or vertical, NAND flash array; or a NOR flash array.

Many variations are possible. For example, a different organization can be used with different addressing lines; or additional addressing or enable lines can be used arranged in the row, column, or layer directions. As another example, a three-dimensional array of cells can embody a gate array, a field-programmable gate array (FPGA), or custom logic, which can have different addressability requirements than illustrated for structure 400. Three-dimensional structures can have generally repeating layer patterns, or can have heterogeneous layers. For examples layers for digital electronics, power electronics, RF devices, or guided optics can be combined in any combination.

Second Example Apparatus

Figure 5:
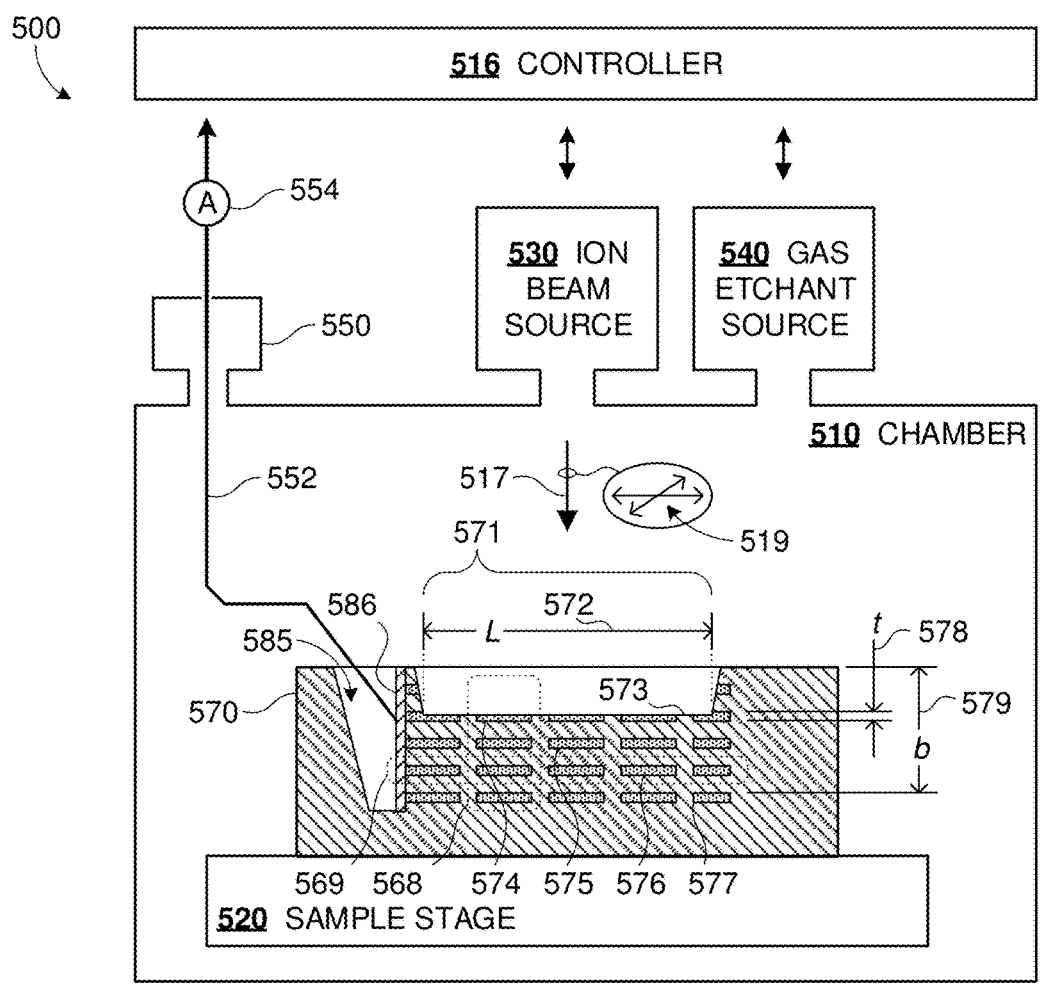
FIG. 5 illustrates a second example apparatus according to the disclosed technologies.

FIG. 5 illustrates an example apparatus 500 according to the disclosed technologies. Apparatus 500 can be used to delayer a stacked electronic structure, layer by layer, using a combination of ion beam and gas etching.

Apparatus 500 includes a gas etchant source 540 and an ion beam source 530 coupled to one or more ports of the chamber 510, in which a sample 570 is mounted on a sample stage 520. The gas etchant source can deliver a gas etchant to a working surface 573 of sample 570, and the ion beam source 530 can deliver an ion beam to the working surface 573. Controller 516 can be coupled to operate the gas etchant source 540 and the ion beam source 530, and can be configured to reach successive etch stops at respective target layers as described herein. In examples, the controller 516 can be configured to operate the gas etchant source 540 and the ion beam source 530 in an alternating sequence of etch phases and purge phases. The etch phases can be configured to provide etching (delayering) of an ROI 571 of the sample 570 mounted on stage 520, with a combination of chemical and ion beam etching. The purge phases can be configured to refresh gas in chamber 510 or proximate to a region of interest 571 of the sample 570.

Port 550 can provide an output signal from chamber 510 to the controller 516, the output signal being indicative of etch stops. In some examples, the output signal can be a body current measured from sample 570, via conductive path 552 and ammeter 554. In other examples, the output signal can be an electron scattering current from an ion beam 517 impinging on the ROI 571. Either of these current signals can be indicative of etch rate, and accordingly a drop in the signal signifies a reduction in etch rate, or an etch stop. The etch stop can result from differential etching rates between a target layer and other layers of the sample 570. Responsive to reaching an etch stop, the controller can be configured to pause the alternating sequence of etch and purge phases, either immediately or after a delay.

In some examples, the gas etchant source 540 can include a store of an etching gas, which can be delivered into the chamber 510 for ion-beam assisted milling. The etching gas can include 2,2,2 trifluoroacetamide (TFA). Other gas chemistries that can be used include Dx, $XeF_2$, or $H_2O$ (water vapor). The ion beam source 530 can deliver a focused ion beam 517 to the ROI 571. In some examples the ion beam 517 can be a Xe+ ion beam from a plasma source, while in other examples a Ga+ beam from a liquid source can be used. Other ions that can be used include W, C, and Pt. The ion beam can be scanned or swept in two transverse directions 519 to cover the region of interest 571.

Sample 570 can be generally similar to sample 170 described herein, and can be a stacked electronic structure. The structure 570 can have multiple unit devices organized in layers such as 569 or in columns such as 568. Some layers can be target layers having respective unit devices 574-577 at which etch stop behavior at the respective layers can aid in characterization of the unit devices 574-577. Optionally, an isolation trench 585 or a conductive coating 586 can be used on all or part of a perimeter of the ROI 571 to improve performance of a detected current signal during a delayering procedure. However, neither the isolation trench 585 nor the conductive coating 586 is required. In some examples, either the trench 585 or the conductive coating 586 can be limited to one side of the ROI 571, or can extend part way around the ROI 571. A lowest layer (that of device 577) among the target layers can be designated a base layer. FIG. 5 illustrates sample 570 partway through a delayering procedure, where the ROI 571 has been etched down to target layer of device 574. FIG. 5 also indicates some representative dimensions, such as a transverse extent L 572 of the ROI 571, a thickness t 578 of a target layer, and the depth b 579 to the base layer. Inasmuch as delayering over an ROI commonly introduces tapering of a sidewall, the ROI 571 and its transverse extent L 572 are generally considered at the bottom of the etch (i.e. working surface 573), as shown in FIG. 5. One or more of the target layers containing devices 574-577 can be principally polysilicon.

Numerous variations are possible. Apparatus 500 can further include a controller; a load lock or translation stage for sample handling; one or more pumps or valves for controlling gas flow; a power supply; or pressure, temperature or other process monitoring sensors. Alternative signals can be used to detect etch stops. For example, the etch depth and etch stop can be tracked by a depth measurement, such as by laser interferometer, or by a surface diagnostic, such as a camera or scanning electron microscope (SEM) image. X-ray scattering (e.g. X-ray photoelectron spectroscopy, XPS, or electron spectroscopy for chemical analysis, ESCA) can also be used. Sample stage 520 can variously serve to hold the sample 570, to transfer the sample in and out of the chamber 510, or to provide sample translation within the chamber 510, for example stepping multiple samples or multiple regions of a single sample through an area accessible to ion beam 517.

Second Example Method

Figure 6:
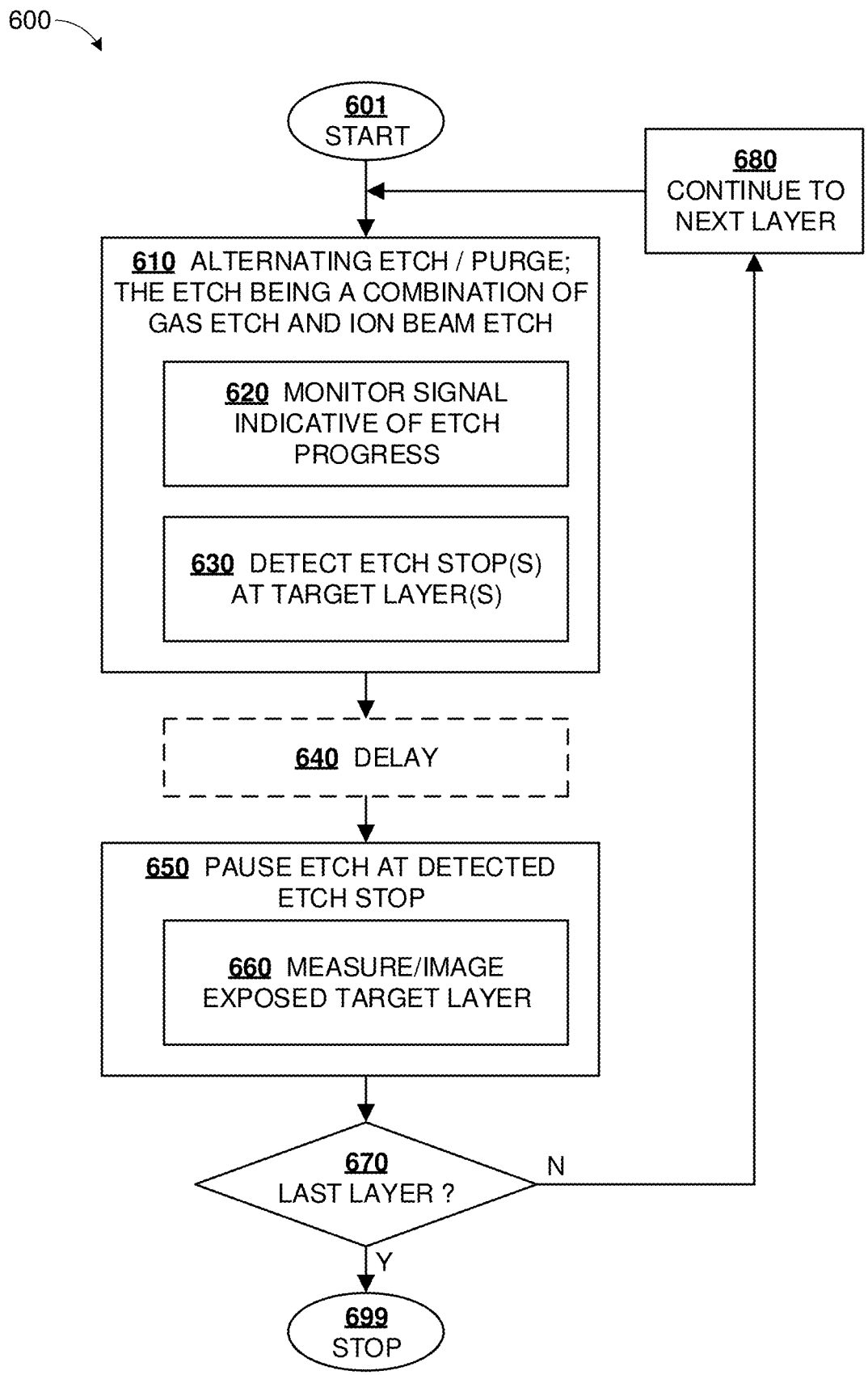
FIG. 6 is a flowchart of a second example method according to the disclosed technologies.

FIG. 6 is a flowchart 600 of an example method according to the disclosed technologies. At process block 610 etching of a stacked electronic structure can be performed in an alternating sequence of etching phases and purging phases. In an etching phase, a combination of gas etch and ion beam etch can be used. In some examples, the presence of an ion beam can assist the gas etching, so that the combination of gas etch and ion etch can provide etching rates beyond those achieved by the gas etch and ion etch operating separately, dependent on a material being etched. In a purging phase, gas in an active process zone proximate to the electronic structure can be refreshed from an associated gas supply.

Concurrent with process block 610, a signal indicative of etch progress can be monitored at process block 620. In some examples, the monitored signal can be an electrical current such as a scattered electron current or a body current from the stacked electronic structure. Dependent on the signal monitoring, successive etch stops can be detected at respective target layers of the structure, at process block 630. In some examples, the target layers can be polysilicon layers.

At process block 650, etching can be paused, either directly upon detection of an etch stop or after a delay 640. During such pause, measurements on the target layer can be performed, or images can be acquired, at process block 660. Images can be acquired using an optical camera, scanning electron microscope (SEM), a focused ion beam (FIB) camera, or another modality. Measurements can include dimensional measurements (e.g. geometric size of a feature), derived geometrical properties (e.g. deviations from an ideal circular, elliptical, or rectangular shape), measurement of surface properties (e.g. resistivity, reflectivity, x-ray scattering analysis), or other measurements.

Delay 640 can serve to advance the working surface further into a target layer, or even into a subsequent layer, so that characterization of the working surface at process block 660 occurs at a desired depth relative to the etch stop. Alternatively or additionally to delay 640, the working surface can be advanced past the etch stop using a different milling configuration. In some examples, an aggressive XeF2-assisted ion beam etch can be applied after reaching an etch stop and prior to performing surface characterization. In other examples, chemical-mechanical polishing, plasma etch, or other techniques can be used.

Then, once measurements or images required for characterization of the target layer are complete, the method proceeds to block 670, where a determination can be made whether additional layers remain to be reached. If there are no additional target layers remaining, the method follows the Y branch to 699 where the method is completed. If there are target layers remaining to be exposed, the method follows the N branch via block 680 to continue delayering to the next target layer, recommencing etch/purge processing at process block 610.

The process of FIG. 6 can be applied to a variety of sample devices, such as a vertical flash memory device, or a 3-D vertical NAND structure. In some examples, the gas etch can be 2,2,2 trifluoroacetamide (TFA). In further examples, the ion beam can be a Xe+ beam, e.g. from a plasma source.

Figure 7B:
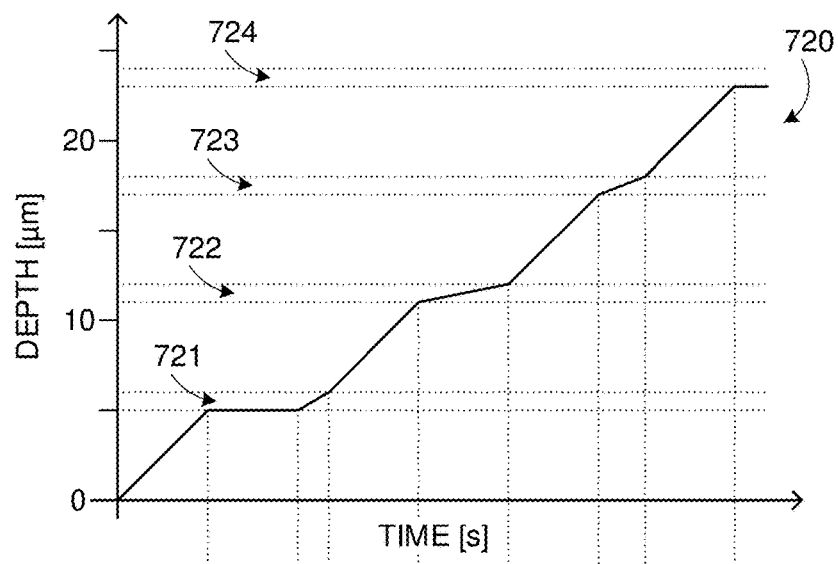
FIGS. 7A-7B are graphs of an illustrative procedure according to the disclosed technologies.
Figure 7A:
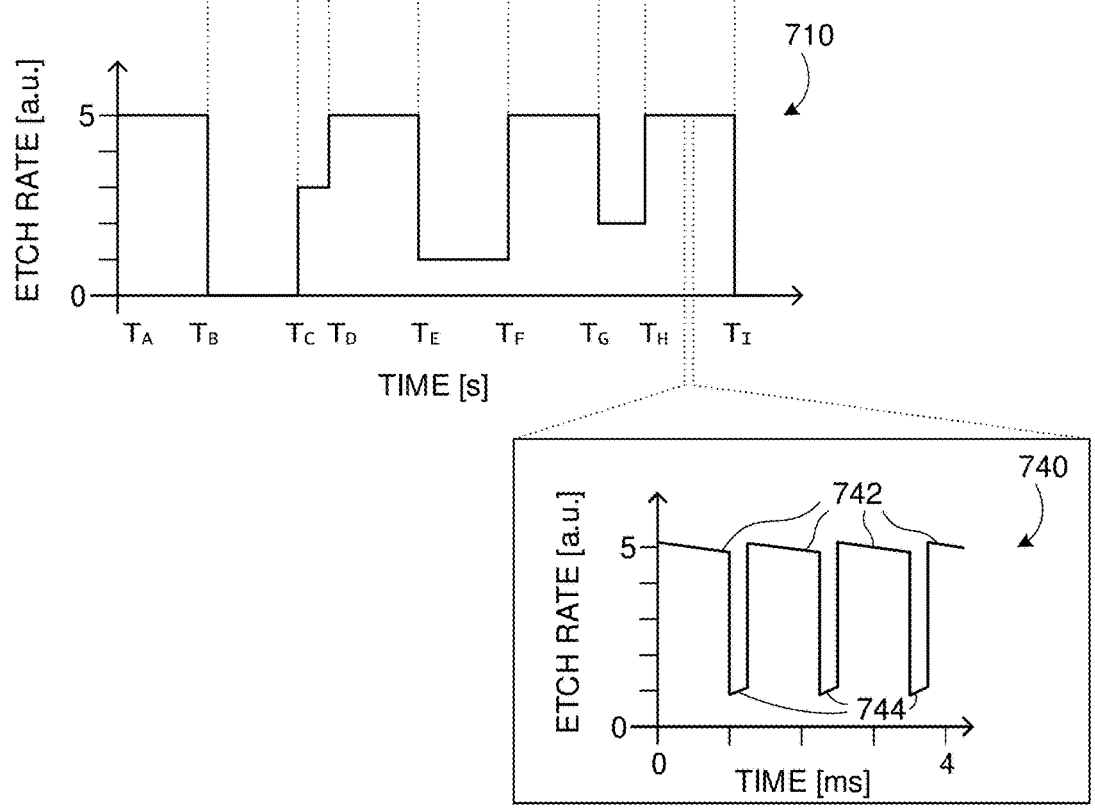

FIGS. 7A-7B include three graphs 710, 720, 740 of an illustrative procedure according to the disclosed technologies, pertaining to delayering of a three-dimensional electronic structure. Graph 710 shows etch rate as a function of time, while graph 720 shows the corresponding progression of delayering, as etched depth vs. time. The time on the horizontal axis can be on the order of tens, hundreds, or thousands of seconds, depending on the particulars of the delayering tool and the volume of material to be removed.

For clarity of illustration and because of the disparate timescales involved, graphs 710, 720 do not reflect the purge phases interleaved among etching phases. Typically, the etch/purge cycles occur on a timescale of hundreds of microseconds to about a second, and accordingly tens, hundreds, or thousands of etch/purge cycles can occur during intervals shown in graph 710. However, an inset graph 740 is provided to illustrate the etch/purge cycles on an expanded timescale, and will be discussed separately.

Milling rates can be measured as volume of material removed (e.g. in $\mu m^3$) per ion beam dosage (e.g. in charge units such as nC), and can depend on the milling configuration, the sample material, or process parameters. For some examples described herein, with a Xe+ beam assisted by TFA gas, the milling rates can commonly be in the range 0.4-4 $\mu m^3/nC$, can be in the range 0.01-100 $\mu m^3/nC$ or any sub-range thereof. Ion milling rates without gas assist can be lower by about a factor of 4, or by a factor in the range 2-8, i.e. commonly in a range 0.1-1 $\mu m^3/nC$. Other example gas chemistries, ion beams, or process parameters can provide varying etching rates in a range of 0.01-1 $\mu m^3/nC$, 0.001-100 $\mu m^3/nC$, or any sub-range thereof.

In the illustrated procedure, etching is performed with a combination of an ion beam and gas etching. For the purpose of illustration, both the gas and the ion beam are presumed able to etch independently at arbitrarily chosen rates of 1 and 2 in a target layer, with a combined etch rate of 3 in the target layer but 5 in other layers. These etch rates are for illustration purposes only and are not limiting to the disclosed techniques. In general, ion-beam induced etching can generate different etch rates based on whether the process is more milling or more chemical etching, and this combination sweeps a continuum from predominantly one to the other with associated changes in etch rate. The sample device has target layers 721-724, each of 1 µm thickness, successive pairs being separated by 5 µm.

These rates are selected merely for purpose of simple illustration. In some examples, the etch rate of gas alone can be negligible, yet the combination etch rate (ion beam and gas etchant) can be greater than ion beam alone, in the target layers, in other layers, or in both. In other examples, the combined etch rate in the target layer can be equal to or less than the sum of the individual gas and ion beam milling rates. In further examples, the independent milling rates (i.e. gas alone, ion beam alone) can be different in different layers.

Turning to graphs 710, 720, the illustrated procedure begins at time $T_A$ with ion beam and gas flow both active. As shown, material above a first target layer 721 can be etched at a rate of 5, until the etch stop is detected at time $T_B$ and both the ion beam and the gas etchant can be turned off. Accordingly, with no etching active, the depth stays unchanged at 5 µm until the ion beam and gas are turned on at time $T_C$. During the interval $T_B$-$T_C$, measurements or images can be taken for characterization of the target layer 721 with online or offline analysis. The target layer 721 can be etched at a rate of 3 (ion beam etch and gas together), reaching a depth of 6 µm at time $T_D$. At this time, the etch rate can increase to 5 for the different material, and etching can continue until target layer 722 is reached at a depth of 11 μm at time $T_E$. At this time, the ion beam can be turned off, and the gas can continue to slowly etch the target layer 722 at an etch rate of 1 (gas alone); any required measurement or imaging can be performed during the interval $T_E$-$T_F$. Once the target layer 722 has been etched through at time $T_F$, the ion beam can be restarted, and etching can proceed at a rate of 5 until the target layer 723 is reached at time $T_G$. Here, the gas can be turned off, and can be flushed or pumped from the process chamber. With ion beam left on, etching can proceed slowly at an etch rate of 2 until the target layer 723 has been etched through. Some measurements or imaging can be performed concurrently with the slow ion etch. With gas restored at time $T_H$, etching at a rate of 5 can be resumed until the last target layer 724 is reached at time $T_I$ and at a depth of 23 μm. With delayering complete, both ion beam etch and gas etch can be turned off at $T_J$.

Although some variations have been illustrated in this illustration, numerous additional variations are possible. In some examples, the gas by itself does not provide any significant etching, and operates wholly under ion beam assist. In further examples, the decision to stop etching can be made at a time or depth offset from the time an etch stop is detected, to aim for a central depth within a target layer, or even to aim for a layer beneath where the etch stop was detected. In additional examples, etch rates can be controlled according to an instant layer, by controlling the ion beam or the gas flow. Different ion beams or different gas etchants can also be used to specifically target respective layers.

Turning to the inset, graph 740 of FIG. 7A illustrates a sequence of etch phases 742 including periodic gas recharge operation 744. During an etch phase 742, ion beam and gas can etch together. During a gas recharge phase 744, the ion beam etch can be in an off state.

Numerous variations are possible. As shown, the purge phase has a duration of about 25% of the duration of an etch phase, for an etch phase duty cycle of 80%, however this is not a requirement. The duty cycle of the etch phase can vary from 50% to 95% in varying examples, from 25% to 98%, or commonly from 75% to 90%. The purge phase can be implemented periodically, or with relation to a scan pattern of the ion beam. One raster scan of the ion beam is sometimes dubbed a "loop" and can have a loop time for completion. The purge phase can be implemented at the end of each loop, or more frequently for large patterns, or once every N loops (N=2, 3, 4, 5 . . . ) for small patterns. In a heterogeneous pattern, etch phases can have varying durations, and the following purge phases can have durations that track the duration of an immediately preceding etch phase. The programming of etch and purge phases can be varied for different materials encountered, in different vertical layers or at different transverse positions.

Gas flow during a purge phase can be same as or different from gas flow during an etch phase. Gas flow can be controlled by pulse-width modulation (PWM) of a valve releasing gas from a reservoir into the process chamber, with or without feedback control. The gas flow PWM control can be independent or asynchronous with respect to the etch/purge phase sequence or the milling pattern scan.

Third Example Apparatus

Figure 8:
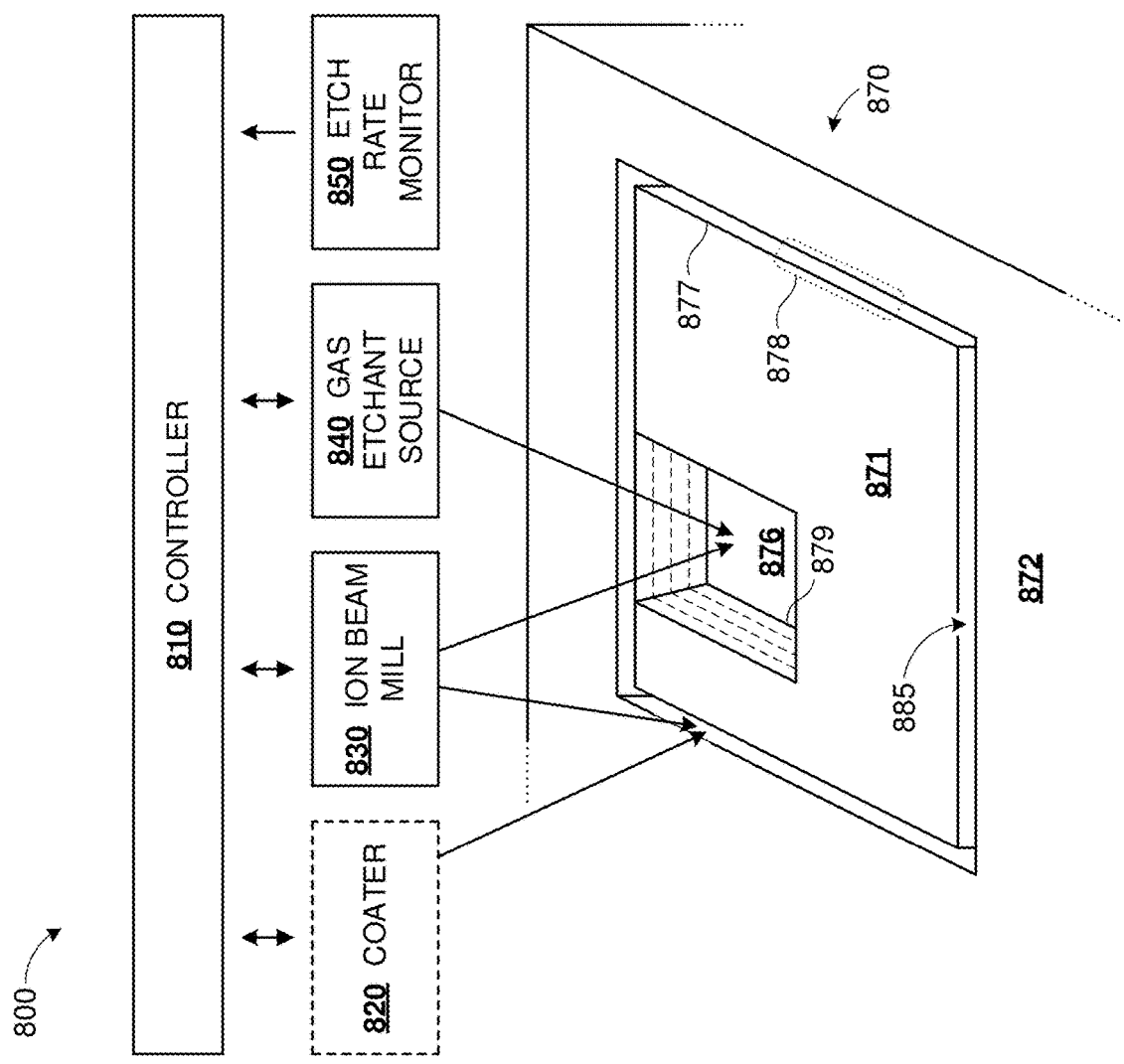
FIG. 8 illustrates a third example apparatus 800 according to the disclosed technologies.

FIG. 8 illustrates a third example apparatus 800 according to the disclosed technologies. Controller 810 can be coupled to control an ion beam mill 830, a gas etchant source 840, and can receive an etch rate monitor signal 850. Optionally, controller 810 can also be coupled to control a coater 820. The controller can be figured to perform process operations on sample 870. In a first aspect, the controller 810 can operate the ion beam mill 830 to form a trench 885 around an ROI 871 of the sample 870, to isolate layers of the ROI 871 from corresponding areas of a neighboring area 872. ROI 871 has a perimeter 877. The trench 885 exposes a lateral surface of the ROI 871 as indicated by dotted outline 878.

In some examples, controller 810 can operate optional coater 820 to form an electrically conductive side wall (not shown) in trench 885. In other examples, controller 810 can form the conductive side wall as a byproduct of milling trench 885 with ion beam mill 830. In a second aspect, the controller 810 can perform delayering of an area 8 within the ROI 871. The illustration shows the delayering having reached a fourth target layer 876 having perimeter 879. Preceding target layers are represented by dashed lines. Variations of apparatus 800 can adopt any of the features of similar components as described herein, or other features.

Third Example Method

Figure 9:
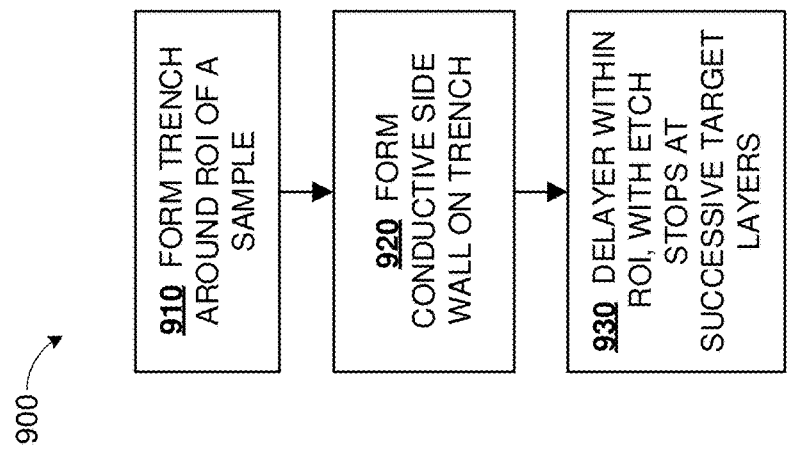
FIG. 9 is a flowchart of a third example method 900 according to the disclosed technologies.

FIG. 9 is a flowchart of a third example method 900 according to the disclosed technologies. At process block 910, a trench can be formed around an ROI of a sample, to at least a depth of a base layer. At process block 920, an electrically conductive side wall can be formed in the trench. The formation of the trench and side wall can be performed with any of the techniques as disclosed herein. Then, at process block 930, a delayering procedure can be performed on an area within the ROI, with etch stops at successive layers. The delayering procedure can be performed with any of the techniques as disclosed herein.

Example Performance Results

Figure 10A:
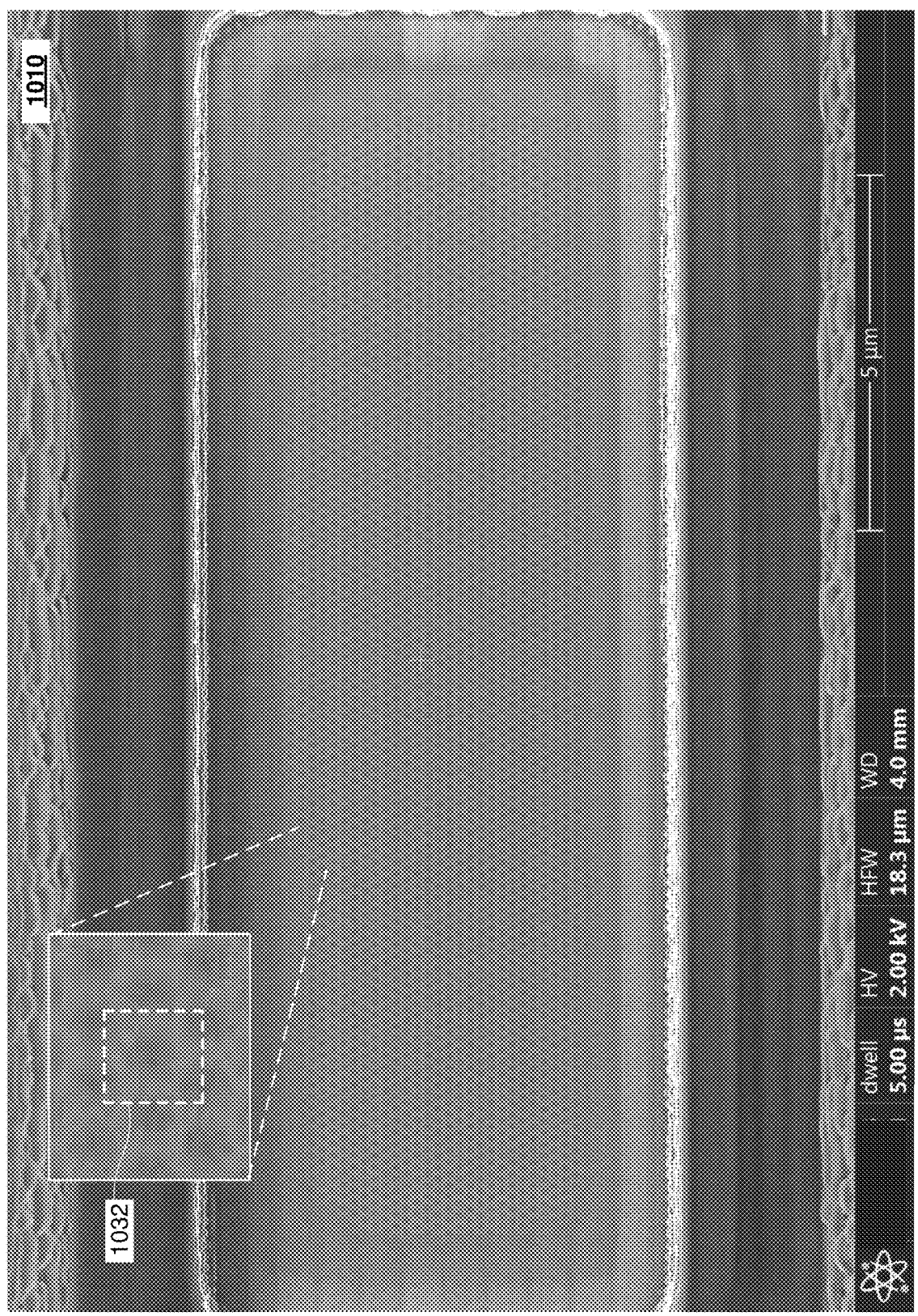
FIGS. 10A-10B are microphotographs illustrating performance of the disclosed technologies.
Figure 10B:
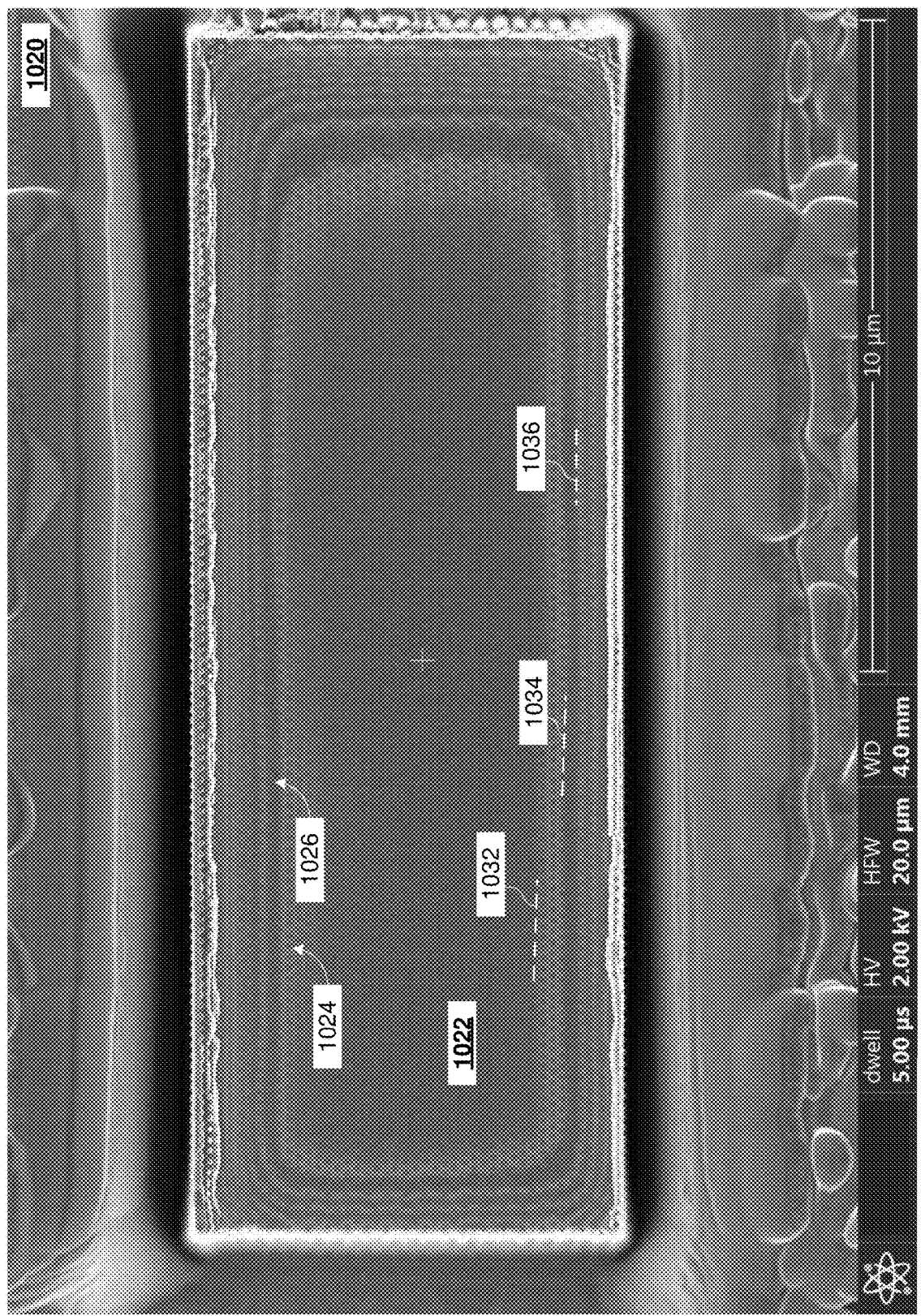

FIGS. 10A-10B are microphotographs 1010, 1020 illustrating performance of the disclosed technologies. FIG. 10A shows a top view of a vertical NAND device prior to a delayering procedure as described herein. A hexagonal pattern of individual NAND stacks (columns with one NAND device per layer) can be seen. The magnified inset shows dashed outline 1012 around one such column.

FIG. 10B shows a top view of the vertical NAND device after delayering to about the ninth target layer 1022, which is seen as a substantially uniform dark region, approximately 15 μm×3.8 μm in extent, in the center of the image. In this image the target layers are polysilicon layers, separated by light-shaded layers of substantially silicon dioxide. The alternating rings around the central target layer indicate alternating polysilicon and silicon dioxide layers along a tapering sidewall of the delayering excavation.

Measures of planar delayering can be based on flatness or roughness of an exposed target layer. With reference to a mean surface height h0 of a region, the mean profile deviation Ra is the mean of the deviation of the surface profile from h0 over the region. Ra=Average (|h−h0|), where h is the surface height at a spot in the region, and the average is the arithmetic mean over the region. The peak-to-valley height Rt is defined as Rt=max(h)−min(h), where max(h) and min(h) are the maximum and minimum values of the surface height over the region. In examples, the disclosed technologies can achieve Rt better than 1, 2, 5, or 10 nm over at least 80%, at least 90%, or at least 95% of the area of the exposed target layer at the $10^{th}$ target layer counted from the top. In examples, the disclosed technologies can achieve Rt better than 2, 5, 10, or 20 nm over at least 80%, at least 90%, or at least 95% of the area of the exposed target layer at the $10^{th}$ target layer counted from the top. Areas near the perimeter of the exposed target layer, where the working surface meets a slant sidewall, can be excluded from such measurements, and the measurements can be restricted to a convex region free of holes.

Another measure of planar delayering can be found by comparing an exposed area of a target layer 1022 with a bounding area of a reference layer 1024, 1026 above the target layer. In varying examples, the exposed area of target layer 1022 can be a total exposed area, a largest contiguous area, a largest convex puncture-free area, or another measure of target layer 1022, and can be determined from an image when a delayering process has reached the target layer 1022. In varying examples, the reference layer 1024, 1026 can be the layer immediately above target layer 1022, the layer two above target layer 1022, a target layer immediately preceding target layer 1022, or the closest similar layer above target layer 1022. The bounding area of reference layer 1024, 1026 can be the area enclosed by an outer perimeter of layer 1024, 1026, measured from the same image, at the same time, or under the same conditions, as the measurement of exposed area of target layer 1022. Perimeter and area determinations can be based on grayscale of an image such as microphotograph 1020, such as midway between a grayscale value of an instant layer (target layer or reference layer) and a grayscale value of an adjacent layer. Dashed lines 1032, 1034, 1036 respectively indicate portions of the perimeters of layers 1022, 1024, 1026.

The disclosed technologies can be fast as compared to other conventional techniques. In trials, a commercially available 64 layer three-dimensional NAND flash memory device was characterized at three different sites, at three different layers (layers 6, 22, and 44 from the top), totaling over 2000 devices, in under 140 minutes.

In FIG. 10B, the largest contiguous area of 1022 is about 70 $\mu m^2$ as noted above. Using 1024 as the reference area, its extent is about 16 $\mu m \times 4.4$ $\mu m$. Thus, the ratio of areas of 1022:1024 is about $(15 \times 3.8):(16 \times 4.4)=57.0:70.4=81\%$. Alternatively, using preceding target layer 1026 as the reference area, its extent is about 16.3 $\mu m \times 4.8$ $\mu m$, yielding a ratio of areas of about 57.0:78.2=73%.

Figure 11:
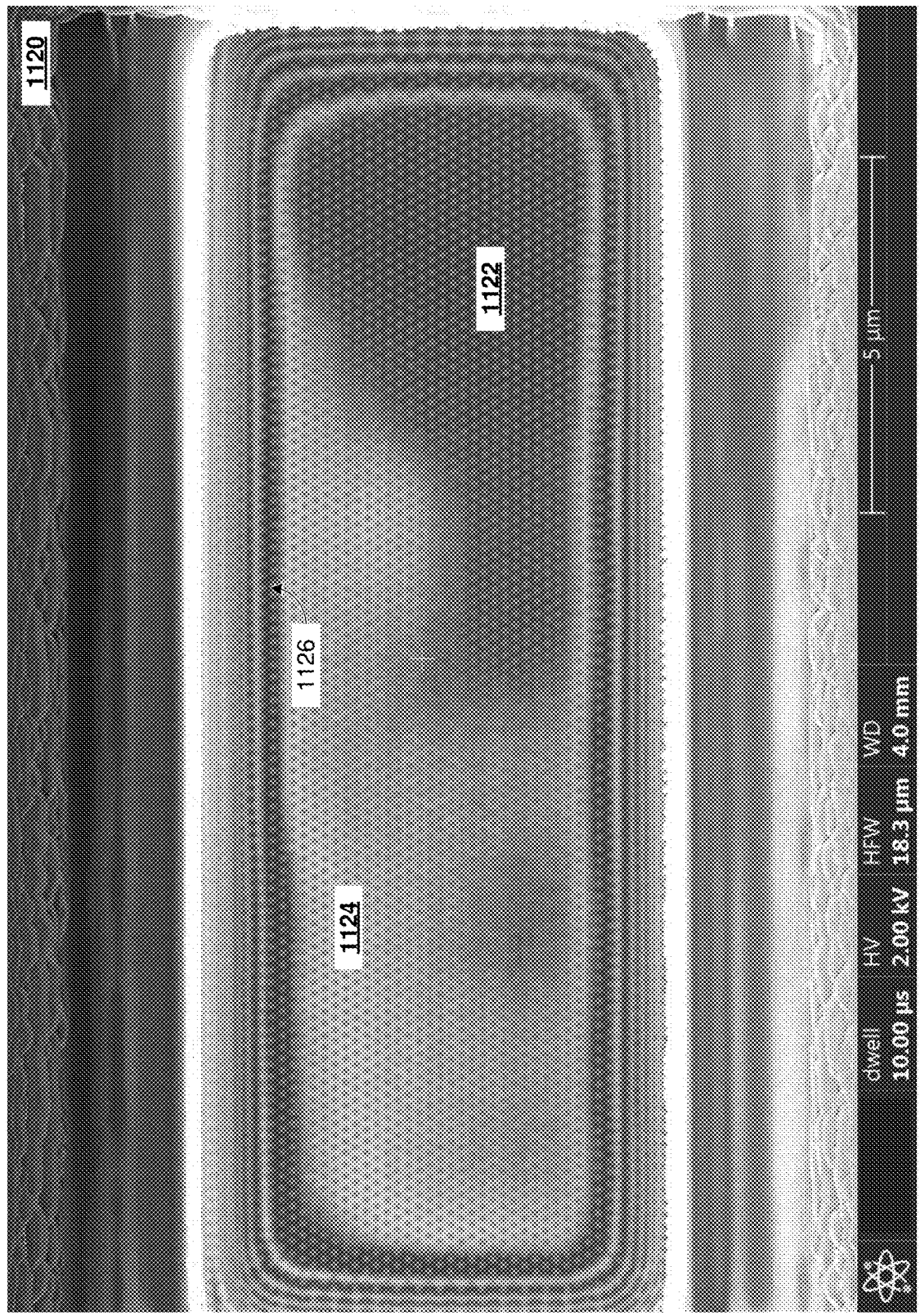
FIG. 11 is a microphotograph illustrating performance of a comparative method.

FIG. 11 is a microphotograph 1120 illustrating performance of a comparative method on a similar device as FIGS. 10A-10B, and starting from a similar configuration as FIG. 10A. The uneven delayering is evident. Approximately the eighth target layer 1122 has an area of approximately 22 $\mu m^2$, while preceding silicon dioxide layer 1124 has an extent of about 70 $\mu m^2$, and the previous target layer 1126 has an area of about 81 $\mu m^2$. Thus the ratio of areas 1122:1124 is only about 22:70=31%, and the ratio of areas 1122:1126 is about 22:81=27%. The disclosed technology provides more than double the usable planar area at nine layers down in the stack.

Using the area ratio measure described above, the disclosed technologies can achieve at least 50%, at least 60%, at least 70%, at least 80%, or at least 90%, in varying examples, at or up to a tenth, $20^{th}$, or $50^{th}$ target polysilicon layer of a functional stacked electronic device such as a vertical NAND device, for a region of interest having an area of about 5 $\mu m \times 15$ $\mu m$ the topmost layer. Generally, the achievable area ratios can depend on the geometry or aspect ratio of the region of interest, or on the vertical pitch of successive target layers.

Figure 12:
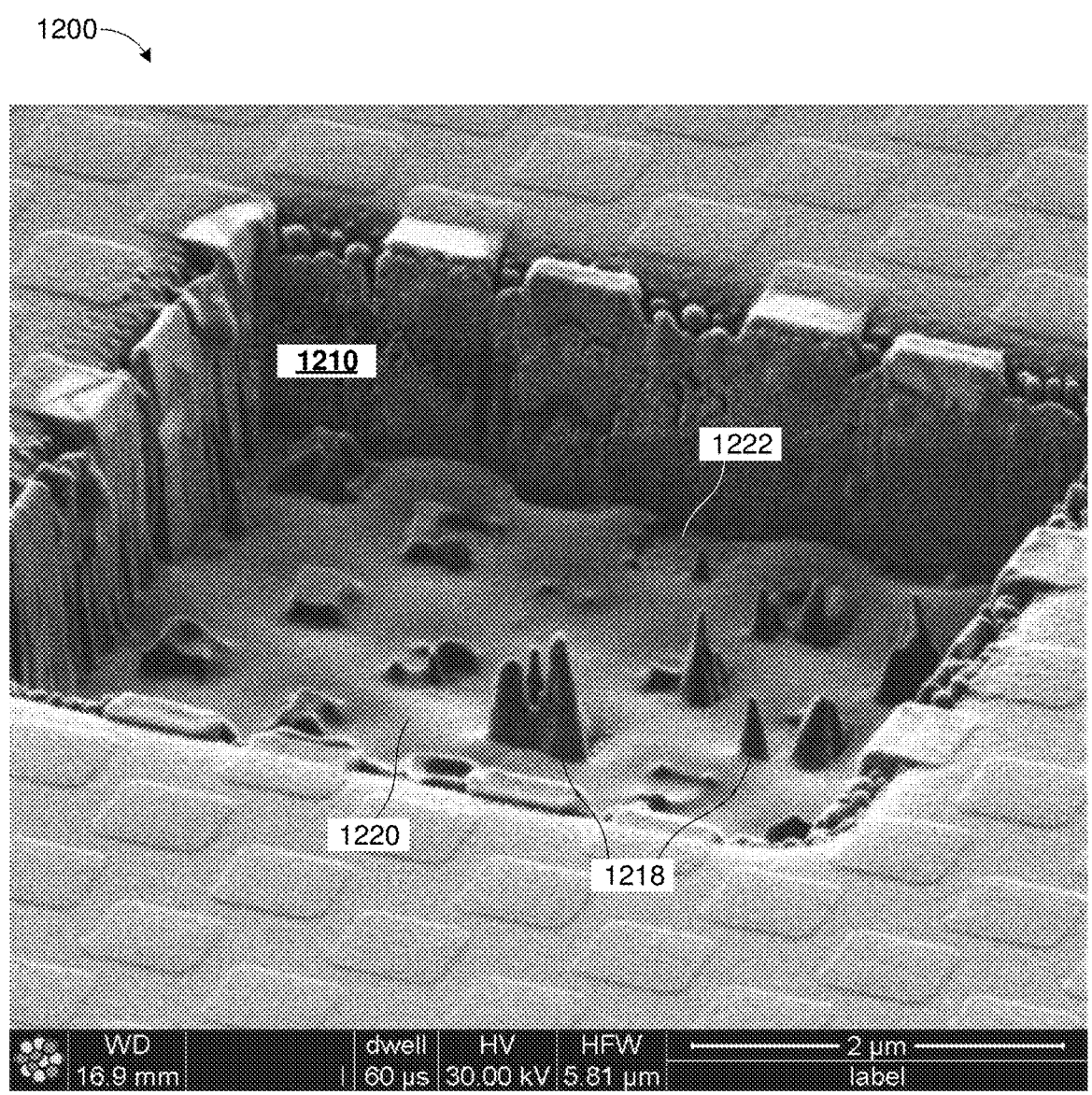
FIG. 12 is a microphotograph illustrating performance of a comparative method.

FIG. 12 is a microphotograph 1200 illustrating performance of bare ion milling, a comparative method. Trench 1210 is shown milled into a sample, to reach a target layer 1220. Numerous islands 1218 can be seen, where milling has not reached the target layer 1220. A puncture 1222 can also be seen, where milling penetrated through the target layer 1220 to a lower layer.

A Generalized Computer Environment

Figure 13:
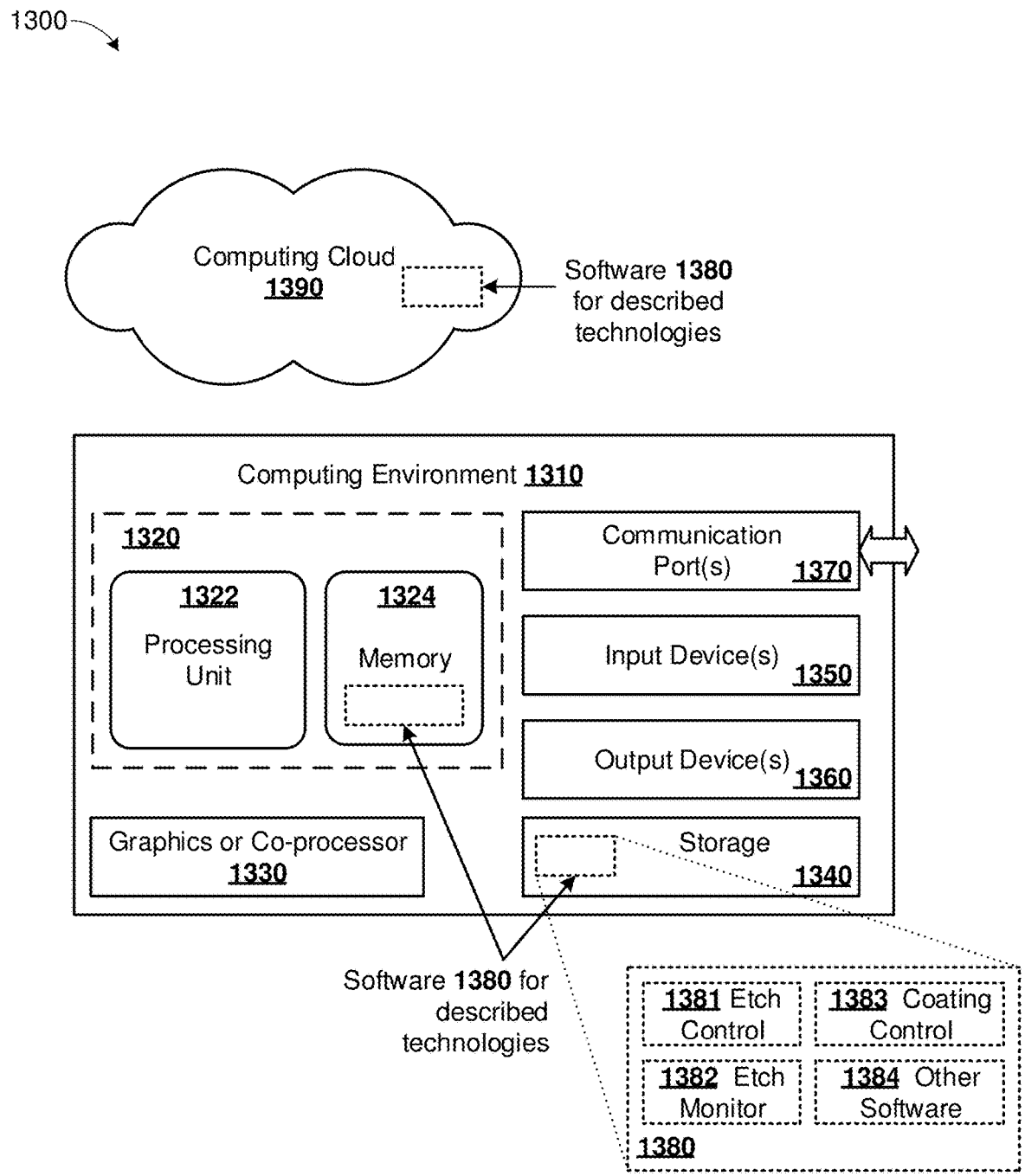
FIG. 13 illustrates a generalized example of a suitable computing environment in which described embodiments, techniques, and technologies pertaining to a disclosed non-linear optical device can be implemented.

FIG. 13 illustrates a generalized example of a suitable computing system 1300 in which described examples, techniques, and technologies for sample preparation, with e.g. delineation etch delayering or a conductive coated trench, can be implemented. The computing system 1300 is not intended to suggest any limitation as to scope of use or functionality of the present disclosure, as the innovations can be implemented in diverse general-purpose or special-purpose computing systems. The computing system 1300 can control a sample preparation system, including an etching tool, an ion milling machine, a coating tool, a CVD system, an ion beam assisted coater, a gas flow or pumping system, valves, a load lock, a sample handling system, or associated instrumentation; or can acquire, process, output, or store measurement data.

With reference to FIG. 13, computing environment 1310 includes one or more processing units 1322 and memory 1324. In FIG. 13, this basic configuration 1320 is included within a dashed line. Processing unit 1322 can execute computer-executable instructions, such as for control or data acquisition as described herein. Processing unit 1322 can be a general-purpose central processing unit (CPU), a processor in an application-specific integrated circuit (ASIC), or any other type of processor. In a multi-processing system, multiple processing units execute computer-executable instructions to increase processing power. Computing environment 1310 can also include a graphics processing unit or co-processing unit 1330. Tangible memory 1324 can be volatile memory (e.g., registers, cache, or RAM), non-volatile memory (e.g., ROM, EEPROM, or flash memory), or some combination thereof, accessible by processing units 1322, 1330. The memory 1324 stores software 1380 implementing one or more innovations described herein, in the form of computer-executable instructions suitable for execution by the processing unit(s) 1322, 1330. For example, software 1380 can include software 1381 for controlling an etching process (including control of etch and purge phases), software 1382 for controlling a coating process, software 1383 for monitoring for etch stops, or other software 1384. The inset shown for software 1380 in storage 1340 can be equally applicable to software 1380 elsewhere in FIG. 13. The memory 1324 can also store control parameters, calibration data, measurement data, or database data. The memory 1324 can also store configuration and operational data.

A computing system 1310 can have additional features, such as one or more of storage 1340, input devices 1350, output devices 1360, or communication ports 1370. An interconnection mechanism (not shown) such as a bus, controller, or network interconnects the components of the computing environment 1310. Typically, operating system software (not shown) provides an operating environment for other software executing in the computing environment 1310, and coordinates activities of the components of the computing environment 1310.

The tangible storage 1340 can be removable or non-removable, and includes magnetic disks, magnetic tapes or cassettes, CD-ROMs, DVDs, or any other medium which can be used to store information in a non-transitory way and which can be accessed within the computing environment 1310. The storage 1340 stores instructions of the software 1380 (including instructions and/or data) implementing one or more innovations described herein. Storage 1340 can also store image data, measurement data, reference data, calibration data, configuration data, or other databases or data structures described herein.

The input device(s) 1350 can be a mechanical, touch-sensing, or proximity-sensing input device such as a keyboard, mouse, pen, touchscreen, or trackball, a voice input device, a scanning device, or another device that provides input to the computing environment 1310. The output device(s) 1360 can be a display, printer, speaker, optical disk writer, or another device that provides output from the computing environment 1310. Input or output can also be communicated to/from a remote device over a network connection, via communication port(s) 1370.

The communication port(s) 1370 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, acoustic, or other carrier.

A data acquisition system can be integrated into computing environment 1310, either as an input device 1350 or coupled to a communication port 1370, and can include analog-to-digital converters or connections to an instrumentation bus. An instrumentation control system can be integrated into computing environment 1310, either as an output device 1360 or coupled to a communication port 1370, and can include digital-to-analog converters, switches, or connections to an instrumentation bus.

In some examples, computer system 1300 can also include a computing cloud 1390 in which instructions implementing all or a portion of the disclosed technology are executed. Any combination of memory 1324, storage 1340, and computing cloud 1390 can be used to store software instructions and data of the disclosed technologies.

The present innovations can be described in the general context of computer-executable instructions, such as those included in program modules, being executed in a computing system on a target real or virtual processor. Generally, program modules or components include routines, programs, libraries, objects, classes, components, data structures, etc. that perform particular tasks or implement particular data types. The functionality of the program modules can be combined or split between program modules as desired in various embodiments. Computer-executable instructions for program modules can be executed within a local or distributed computing system.

The terms "computing system," "computing environment," and "computing device" are used interchangeably herein. Unless the context clearly indicates otherwise, neither term implies any limitation on a type of computing system, computing environment, or computing device. In general, a computing system, computing environment, or computing device can be local or distributed, and can include any combination of special-purpose hardware and/or general-purpose hardware and/or virtualized hardware, together with software implementing the functionality described herein.

General Considerations

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items. Furthermore, as used herein, the terms "or" and "and/or" mean any one item or combination of items in the phrase.

The systems, methods, and apparatus described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. The technologies from any example can be combined with the technologies described in any one or more of the other examples. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus are referred to as "lowest", "best", "minimum," or the like. It will be appreciated that such descriptions are intended to indicate that a selection among a few or among many alternatives can be made, and such selections need not be lower, better, less, or otherwise preferable to other alternatives not considered.

Theories of operation, scientific principles, or other theoretical descriptions presented herein in reference to the apparatus or methods of this disclosure have been provided for the purposes of better understanding and are not intended to be limiting in scope. The apparatus and methods in the appended claims are not limited to those apparatus and methods that function in the manner described by such theories of operation.

Any of the disclosed methods can be controlled by, or implemented as, computer-executable instructions or a computer program product stored on one or more computer-readable storage media, such as tangible, non-transitory computer-readable storage media, and executed on a computing device (e.g., any available computing device, including tablets, smart phones, or other mobile devices that include computing hardware). Tangible computer-readable storage media are any available tangible media that can be accessed within a computing environment (e.g., one or more optical media discs such as DVD or CD, volatile memory components (such as DRAM or SRAM), or nonvolatile memory components (such as flash memory or hard drives)). By way of example, and with reference to FIG. 13, computer-readable storage media include memory 1324, and storage 1340. The term computer-readable storage media does not include signals and carrier waves. In addition, the term computer-readable storage media does not include communication ports (e.g., 1370).

Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network, a cloud computing network, or other such network) using one or more network computers.

For clarity, only certain selected aspects of the software-based implementations are described. Other details that are well known in the art are omitted. For example, it should be understood that the disclosed technology is not limited to any specific computer language or program. For instance, the disclosed technology can be implemented by software written in Adobe Flash, C, C++, C#, Curl, Dart, Fortran, Java, JavaScript, Julia, Lisp, Matlab, Octave, Perl, Python, Qt, R, Ruby, SAS, SPSS, SQL, WebAssembly, any derivatives thereof, or any other suitable programming language, or, in some examples, markup languages such as HTML or XML, or with any combination of suitable languages, libraries, and packages. Likewise, the disclosed technology is not limited to any particular computer or type of hardware. Certain details of suitable computers and hardware are well known and need not be set forth in detail in this disclosure.

Furthermore, any of the software-based embodiments (comprising, for example, computer-executable instructions for causing a computer to perform any of the disclosed methods) can be uploaded, downloaded, side-loaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, infrared, and optical communications), electronic communications, or other such communication means.

In view of the many possible embodiments to which the principles of the disclosed subject matter may be applied, it should be recognized that the illustrated embodiments are only preferred examples of the disclosed subject matter and should not be taken as limiting the scope of the claims. Rather, the scope of the claimed subject matter is defined by the following claims. We therefore claim all that comes within the scope and spirit of these claims.

We claim:

1. An apparatus comprising:
    an etcher; and
    a controller coupled to the etcher, the controller configured to:
        electrically isolate a region of interest (ROI) of a sample from a surrounding area of the sample by causing the etcher to etch a trench around the ROI, the etched trench exposing a lateral surface of the ROI; and
        electrically couple two or more conductive layers of the sample by causing electrically conductive material to be coated over the lateral surface exposed by the trench.

2. The apparatus of claim 1, wherein the etcher comprises an ion milling machine.

3. The apparatus of claim 2, wherein the ion milling machine produces a Ga+ or Xe+ ion beam.

4. The apparatus of claim 2, wherein the etching of the trench is performed by milling, and the electrically coupling is performed as a byproduct of the milling of the trench.

5. The apparatus of claim 4, wherein the trench width is in a range of 0.2-5 μm.

6. The apparatus of claim 1, further comprising a coater coupled to the controller, wherein the coater is an ion beam assisted coater and the electrically coupling is performed by the ion beam assisted coater.

7. The apparatus of claim 1, wherein the controller is configured to cause the trench around the ROI to be etched to at least a depth of a conductive base layer of the sample, and the two or more layers include the base layer and a conductive layer above the base layer.

8. The apparatus of claim 7, wherein the trench has a transverse inner dimension in a range 5-500 μm, or a depth in a range of 1-10 μm.

9. The apparatus of claim 1, wherein the trench forms a closed path around the ROI.

10. A method comprising:
    electrically isolating a region of interest (ROI) of a sample from a surrounding area of the sample, by milling a trench around the ROI to at least a depth of a base layer of the sample, the etched trench exposing a lateral surface of the ROI; and
    electrically coupling two or more conductive layers of the sample by causing electrically conductive material to be coated over the lateral surface exposed by the trench.

11. The method of claim 10, wherein the coating electrically couples the base layer to one or more conductive layers above the base layer.

12. The method of claim 10, wherein the sample comprises: a stacked electronic structure, a vertical flash memory structure, or a 3D-NAND stack.

13. The method of claim 10, wherein the lateral surface exposes a plurality of layers of the sample, at least one of which is a poly silicon layer.

14. The method of claim 10, wherein the electrically isolating comprises ion beam milling.

15. The method of claim 14, wherein the coating is a byproduct of the ion beam milling.

16. The method of claim 10, wherein the coating comprises ion assisted coating or ion assisted chemical vapor deposition.

17. An apparatus comprising:
    an etcher; and
    a controller coupled to the etcher, the controller configured to:
        electrically isolate a region of interest (ROI) of a sample from a surrounding area of the sample by causing the etcher to etch a trench around the ROI, the etched trench forming a closed path around the ROI and exposing a lateral surface of the ROI;
        electrically couple two or more conductive layers of the sample by causing electrically conductive material to be coated over the lateral surface exposed by the trench;

subsequent to the two or more conductive layers of the sample being electrically coupled, cause the etcher to perform delayering of the sample within the ROI; and monitor the delayering using a measured body current from the electrically coupled two or more layers of the sample.

18. The apparatus of claim 17, wherein the etcher comprises an ion milling machine.

19. The apparatus of claim 17, wherein the apparatus comprises a coater, and the controller is configured to cause the coater to coat the electrically conductive material, over the lateral surface exposed by the trench, using ion-beam assisted metallization.

20. The apparatus of claim 17, wherein the controller is further configured to pause the delayering based on the measured body current.

* * * * *